(12) United States Patent
Kriltz et al.

(10) Patent No.: US 7,563,347 B2
(45) Date of Patent: Jul. 21, 2009

(54) METHOD OF FORMING COATED ARTICLE USING SPUTTERING TARGET(S) AND ION SOURCE(S) AND CORRESPONDING APPARATUS

(75) Inventors: Uwe Kriltz, Jena (DE); Jochen Butz, Wolfen (DE); Gerald Jänicke, Bobbau (DE); Vijayen S. Veerasamy, Ann Arbor, MI (US)

(73) Assignees: Centre Luxembourgeois de Recherches pour le Verre et la Ceramique S.A. (C.R.V.C.), Grand Duche de Luxemborg; Guardian Industries Corp., Auburn Hills, MI (US)

( * ) Notice: Subject to any disclaimer, the term of this patent is extended or adjusted under 35 U.S.C. 154(b) by 804 days.

(21) Appl. No.: 10/989,728

(22) Filed: Nov. 17, 2004

(65) Prior Publication Data

US 2006/0008657 A1    Jan. 12, 2006

Related U.S. Application Data

(63) Continuation-in-part of application No. 10/893,532, filed on Jul. 19, 2004, now Pat. No. 7,311,975, which is a continuation-in-part of application No. 10/875,515, filed on Jun. 25, 2004, now Pat. No. 7,229,533.

(51) Int. Cl.
  *C23C 14/34*    (2006.01)
(52) U.S. Cl. .................... 204/192.27; 204/192.26; 204/192.28
(58) Field of Classification Search ............ 204/192.26, 204/192.27, 192.28
See application file for complete search history.

(56) References Cited

U.S. PATENT DOCUMENTS

| | | | |
|---|---|---|---|
| 4,851,095 A | | 7/1989 | Scobey et al. |
| 4,919,778 A | * | 4/1990 | Dietrich et al. ........ 204/192.27 |
| 5,080,455 A | | 1/1992 | King et al. |
| 5,122,252 A | * | 6/1992 | Latz et al. ............. 204/298.26 |
| 5,279,722 A | * | 1/1994 | Szczyrbowski et al. 204/192.27 |
| 5,425,861 A | * | 6/1995 | Hartig et al. ........... 204/192.26 |
| 5,443,862 A | | 8/1995 | Buffat et al. |
| 5,514,476 A | | 5/1996 | Hartig et al. |
| 5,569,362 A | | 10/1996 | Lerbet et al. |

(Continued)

FOREIGN PATENT DOCUMENTS

WO    WO 02/46491    6/2002

(Continued)

OTHER PUBLICATIONS

U.S. Appl. No. 10/893,532, filed Jul. 19, 2004.

(Continued)

*Primary Examiner*—Rodney G McDonald
(74) *Attorney, Agent, or Firm*—Nixon & Vanderhye P.C.

(57) ABSTRACT

A coated article is provided that may be used as a vehicle windshield, insulating glass (IG) window unit, or the like. An ion beam is used to treat an infrared (IR) reflecting layer(s) of such a coated article. Advantageously, this has been found to improve sheet resistance ($R_s$) properties, emittance, solar control properties, and/or durability of the coated article. In certain example embodiments, an ion source(s) and a sputtering target(s) used in forming the IR reflecting layer, or any other suitable layer, may be located in a common deposition chamber of an apparatus used in forming at least part of the coating.

27 Claims, 10 Drawing Sheets

U.S. PATENT DOCUMENTS

| | | | |
|---|---|---|---|
| 5,595,825 A * | 1/1997 | Guiselin | 428/428 |
| 6,033,471 A * | 3/2000 | Nakanishi et al. | 117/108 |
| 6,077,621 A | 6/2000 | Allen et al. | |
| 6,261,693 B1 | 7/2001 | Veerasamy | |
| 6,359,388 B1 | 3/2002 | Petrmichl | |
| 6,395,333 B2 | 5/2002 | Veerasamy | |
| 6,447,891 B1 | 9/2002 | Veerasamy et al. | |
| 6,451,434 B1 | 9/2002 | Ebisawa et al. | |
| 6,461,731 B1 | 10/2002 | Veerasamy et al. | |
| 6,495,251 B1 | 12/2002 | Arbab et al. | |
| 6,576,349 B2 | 6/2003 | Lingle et al. | |
| 6,589,658 B1 | 7/2003 | Stachowiak | |
| 6,592,992 B2 | 7/2003 | Veerasamy | |
| 6,592,993 B2 | 7/2003 | Veerasamy | |
| 6,596,399 B2 | 7/2003 | Veerasamy | |
| 6,602,371 B2 | 8/2003 | Veerasamy | |
| 6,623,846 B2 | 9/2003 | Laird | |
| 6,627,317 B2 | 9/2003 | Wang | |
| 6,660,340 B1 | 12/2003 | Kirkpatrick | |
| 6,663,753 B2 | 12/2003 | Veerasamy et al. | |
| 6,665,033 B2 | 12/2003 | Callegari et al. | |
| 6,667,121 B2 | 12/2003 | Wang | |
| 6,689,476 B2 | 2/2004 | Veerasamy et al. | |
| 6,706,363 B2 | 3/2004 | Honda et al. | |
| 6,713,178 B2 | 3/2004 | Veerasamy | |
| 6,723,211 B2 | 4/2004 | Lingle et al. | |
| 7,229,533 B2 | 6/2007 | Veerasamy | |
| 7,311,975 B2 | 12/2007 | Butz et al. | |
| 2002/0064662 A1 | 5/2002 | Lingle et al. | |
| 2002/0146570 A1 | 10/2002 | Choi et al. | |
| 2003/0049464 A1 | 3/2003 | Glenn et al. | |
| 2003/0064198 A1 | 4/2003 | Thomsen et al. | |
| 2003/0150711 A1 | 8/2003 | Laird | |
| 2003/0194567 A1 | 10/2003 | Lingle et al. | |
| 2003/0194570 A1 | 10/2003 | Lingle et al. | |
| 2004/0067362 A1 | 4/2004 | Veerasamy et al. | |
| 2004/0067363 A1 | 4/2004 | Bienkiewicz et al. | |
| 2006/0008657 A1 | 1/2006 | Kriltz et al. | |

FOREIGN PATENT DOCUMENTS

| | | |
|---|---|---|
| WO | WO 03/104519 | 12/2003 |
| WO | WO 2006/012184 | 2/2006 |
| WO | WO 2006/012185 | 2/2006 |
| WO | WO 2006/020136 | 2/2006 |

OTHER PUBLICATIONS

U.S. Appl. No. 10/875,515, filed Jun. 25, 2004.

* cited by examiner

METHOD OF FORMING COATED ARTICLE USING SPUTTERING TARGET(S) AND ION SOURCE(S) AND CORRESPONDING APPARATUS

This is a continuation-in-part (CIP) of U.S. Ser. No. 10/893,532, filed Jul. 19, 2004 now U.S. Pat. No. 7,311,975, which is a CIP of U.S. Ser. No. 10/875,515, filed Jun. 25, 2004 now U.S. Pat. No. 7,229,533, the disclosures of which are hereby incorporated herein by reference.

This invention relates to a coated article including a solar control coating such as a low-emissivity (low-E) coating. In certain example embodiments, the low-E coating includes an infrared (IR) reflecting layer(s) of a material such as silver (Ag) or the like which is ion beam treated. In certain example embodiments, the ion beam treatment is performed in a manner so as to cause the IR reflecting layer to realize compressive stress (as opposed to normal tensile stress), and/or to reduce electrical resistance (sheet resistance $R_s$ and/or bulk resistance) and/or emissivity value(s) of the coated article. Coated articles according to certain example embodiments of this invention may be used in the context of vehicle windshields, insulating glass (IG) window units, other types of windows, or in any other suitable application.

In certain example embodiments of this invention a lid of a deposition chamber supports both a sputtering target(s) (e.g., rotatable CMAG target) and at least one ion source. This permits sputtering and ion beam treatment to take place in the same deposition chamber at approximately the same pressure and/or gas atmosphere. Space can also be saved in this respect. The use of both a sputtering target(s) and an ion beam source(s) in the same chamber can be used in forming any suitable layer (e.g., Ag inclusive layer, or any other suitable type of layer) of various types of coatings on substrates.

BACKGROUND AND SUMMARY OF EXAMPLE EMBODIMENTS OF THE INVENTION

Coated articles are known in the art for use in window applications such as insulating glass (IG) window units, vehicle windows, and/or the like. Example non-limiting low-emissivity (low-E) coatings are illustrated and/or described in U.S. Pat. Nos. 6,723,211; 6,576,349; 6,447,891; 6,461,731; 3,682,528; 5,514,476; 5,425,861; and 2003/0150711, the disclosures of which are all hereby incorporated herein by reference.

In certain situations, designers of coated articles with low-E coatings often strive for a combination of high visible transmission, substantially neutral color, low emissivity (or emittance), low sheet resistance ($R_s$), and good durability. High visible transmission for example may permit coated articles to be more desirable in applications such as vehicle windshields or the like, whereas low-emissivity (low-E) and low sheet resistance ($R_s$) characteristics permit such coated articles to block significant amounts of IR radiation so as to reduce for example undesirable heating of vehicle or building interiors. It is often difficult to obtain high visible transmission and adequate solar control properties such as good IR blockage, combined with good durability (chemical and/or mechanical durability) because materials used to improve durability often cause undesirable drops in visible transmission and/or undesirable color shifts of the product upon heat treatment.

Low-E coatings typically include one or more IR reflecting layers. An IR reflecting layer is typically metallic or mostly metallic, and is often of a material such as silver (Ag), gold (Au), or the like. The silver or gold may be doped with other materials in certain instances. The purpose of the IR reflecting layer(s) is to block significant amounts of IR radiation, thereby preventing the same from undesirably heating up vehicle and/or building interiors which the coated article is protecting.

Generally speaking, the lower the electrical resistance (sheet resistance $R_s$ and/or bulk resistance) of an IR reflecting layer, the better the IR reflecting characteristics thereof. However, it has heretofore been difficult to reduce resistance properties (and thus improve IR reflecting characteristics) of an IR reflecting layer without adversely affecting optical characteristics of a coated article (e.g., visible transmission, color, etc.) and/or durability of a coated article. For instance, significant changes in the thickness of an IR reflecting layer alone may affect resistance, but at the same time may adversely affect durability and/or optical characteristics of the coating.

In view of the above, it will be apparent to those skilled in the art that there exists an example need in the art for a technique for reducing resistance characteristics of an IR reflecting layer(s) thereby improving IR reflecting characteristics thereof and thus solar control properties of a coated article, without significantly adversely affecting durability and/or optical characteristics of the coated article. There also exists a need in the art for a method of making such a coated article.

In certain example embodiments of this invention, an infrared (IR) reflecting layer(s) is ion beam treated using at least ions from an inert gas such as argon (Ar) and/or Krypton (Kr). It has surprisingly been found that if the ion treatment is performed in a suitable manner, this causes (a) the electrical resistance of the IR reflecting layer to decrease compared to if the ion beam treatment was not performed, thereby improving IR reflecting characteristics thereof, (b) the emittance (e.g., normal) of the IR reflecting layer or coating to decrease compared to if the ion beam treatment was not performed, and/or (c) durability of the coated article to improve.

In certain example embodiments of this invention, it has unexpectedly been found that ion beam treatment of an IR reflecting layer of a material such as Ag, Au or the like, causes the stress of the layer to change from tensile to compressive. In this regard, it has been found that the compressive nature of the stress of the IR reflecting layer(s) can function to improve durability (chemical and/or mechanical) of the coated article.

Accordingly, suitable ion beam treating of an IR reflecting layer(s) has been found in certain example embodiments of this invention to achieve a combination of: (i) improved resistance of the IR reflecting layer, (ii) improved emittance, (iii) improved solar control characteristics of the coated article such as IR blocking, and/or (iii) improved durability of the coated article.

In certain example embodiments of this invention, the ion beam treating may be performed in a manner known as "peening." In other words, the ion beam treatment of the IR reflecting layer may be performed after the IR reflecting layer has been originally sputter-deposited. After sputter-deposition of the IR reflecting layer in such instances, an ion beam comprising or consisting essentially of inert gas ions (e.g., Kr and/or Ar) is directed at the IR reflecting layer so as to impinge upon the same for ion beam treatment purposes. It has been found that this is advantageous for one or more of the reasons discussed above.

In other example embodiments of this invention, an IR reflecting layer may be formed in the following manner. First, a seed layer (e.g., of Ag or the like) is formed by sputtering. Then, after sputtering of the seed layer, ion beam assisted deposition (IBAD) is used to form an additional or remainder portion of the IR reflecting layer. In the IBAD type of ion beam treatment, both an ion beam source(s) and a sputtering target(s) are used. An ion beam from the ion beam source (e.g., including Ar+ ions) intersects with the material sputtered from the sputtering target(s) proximate the surface where the additional or remainder portion of the IR reflecting layer is being grown, so that the additional or remainder portion of the IR reflecting layer is grown/formed by a simultaneous combination of both the ion beam and sputtering.

In other example embodiments of this invention, the IR reflecting layer may be formed entirely using IBAD. At the beginning of the IR reflecting layer formation using IBAD, the volts applied to the ion source are low or zero so that the ion beam either is not formed or is of a low power type (i.e., low eV per ion). Then, during formation of the IR reflecting layer after at least some of the layer has been deposited, the voltage at the ion source is increased so as to increase the eV per ion in the ion beam. In other words, the ion energy is increased, either progressively or in a step-like manner, during formation of the IR reflecting layer. This prevents or reduces damages to the lower portion of the layer and/or to the layer under the same.

In certain example embodiments of this invention, a sputtering target(s) and an ion source(s) are located in the same deposition chamber so that they are at approximately the same pressure (e.g., at a pressure less than atmospheric pressure). In certain example embodiments, a lid of a deposition chamber supports both a sputtering target(s) (e.g., rotatable CMAG target) and at least one ion source. This permits sputtering and ion beam treatment to take place in the same deposition chamber at approximately the same pressure and/or gas atmosphere. Space can also be saved in this respect. The use of both a sputtering target(s) and an ion beam source(s) in the same chamber can be used in forming any suitable layer (e.g., Ag inclusive layer, or any other suitable type of layer) of various types of coatings on substrates. For purposes of example, and without limitation, such a structure with both an ion source(s) and a sputtering target(s) supported by the same lid of a deposition chamber, and/or both located in the same chamber at approximately the same pressure, can be used in any of the example embodiments discussed herein. For example, such a structure can be used in embodiments for peening an IR reflecting layer, in IBAD embodiments where the IR reflecting layer is formed using IBAD, and/or in embodiments involving a seed layer which is thereafter subjected to ion beam treatment discussed herein.

In certain example embodiments of this invention, there is provided a method of making a coated article, the method comprising providing a glass substrate; forming at least one dielectric layer on the substrate; providing at least one ion source and at least one sputtering target in a first deposition chamber; forming an infrared (IR) reflecting layer on the substrate over at least the first dielectric layer, where said forming of the IR reflecting layer comprises sputtering said sputtering target located in said first chamber and using an ion beam directed toward the substrate from said ion source located in said first chamber; and forming at least one additional dielectric layer on the substrate over at least the IR reflecting layer.

In other example embodiments of this invention, there is provided an apparatus for forming a coated article, the apparatus comprising a plurality of deposition chambers, including at least first, second and third chambers; a first sputtering target located in the first chamber; a second sputtering target and an ion source each located in the second chamber, wherein the second chamber may be at a different pressure and/or use a different gas atmosphere than the first chamber; and a third sputtering target located in the third chamber.

In certain example embodiments of this invention, there is provided a method of making a coated article, the method comprising: providing a glass substrate; forming at least one dielectric layer on the substrate; forming an infrared (IR) reflecting layer on the substrate over at least the first dielectric layer, where said forming of the IR reflecting layer comprises ion beam treating the IR reflecting layer; and forming at least one additional dielectric layer on the substrate over at least the IR reflecting layer.

In other example embodiments, there is provided a coated article including a glass substrates supporting a coating, wherein the coating comprises: at least one dielectric layer; an IR reflecting layer comprising Ag and/or Au provided on the substrate; at least one additional layer provided on the substrate over at least the IR reflecting layer; and wherein the IR reflecting layer comprises silver and has compressive stress and/or which is graded with respect to argon and/or krypton content.

DETAILED DESCRIPTION OF EXAMPLES OF THE INVENTION

Figure 1:
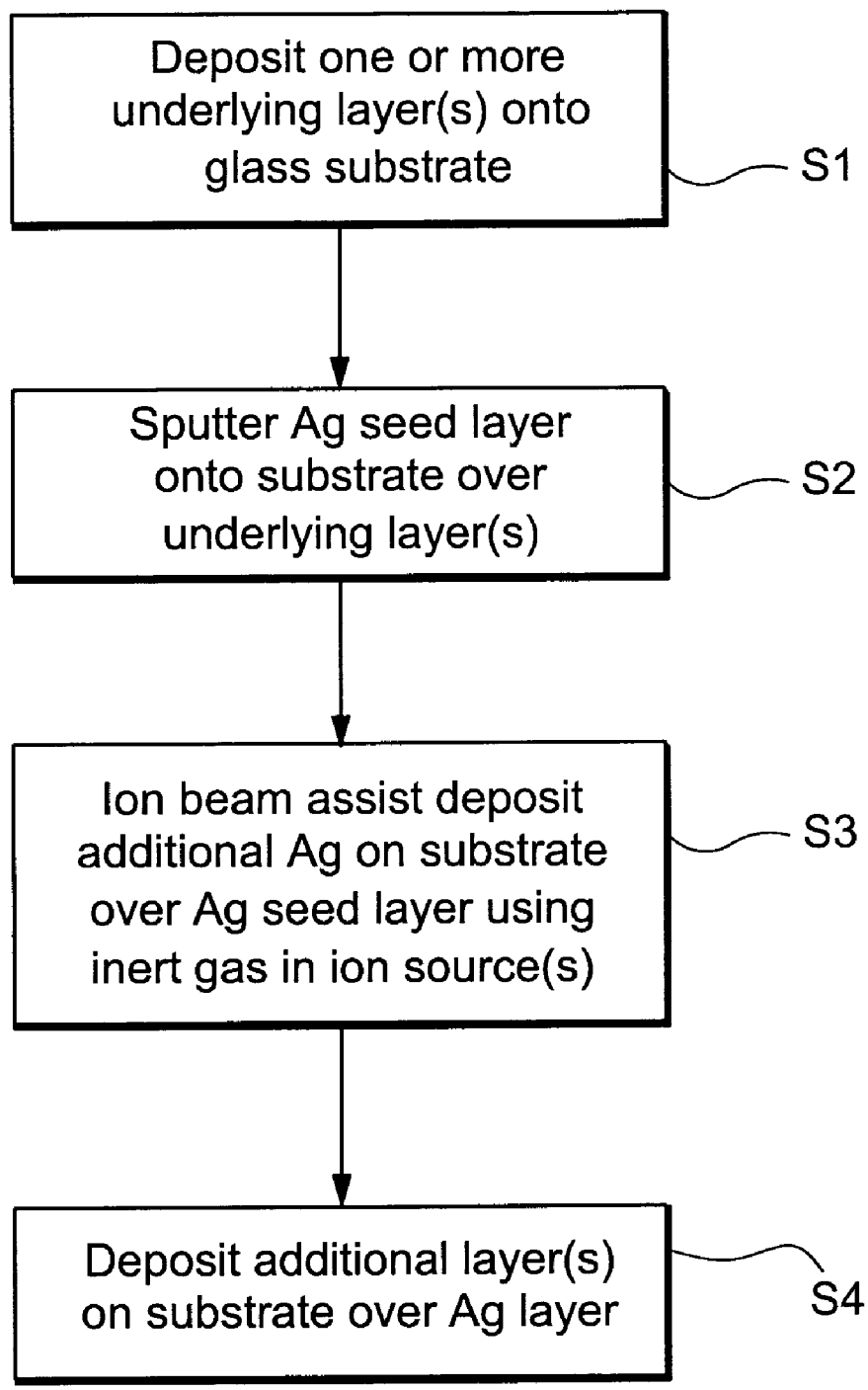
FIG. 1 is a flowchart illustrating certain steps carried out in making a coated article according to an example embodiment of this invention.

Referring now to the accompanying drawings in which like reference numerals indicate like parts throughout the several views.

Coated articles herein may be used in applications such as vehicle windshields, monolithic windows, IG window units, and/or any other suitable application that includes single or multiple glass substrates with at least one solar control coating thereon. In vehicle windshield applications, for example, a pair of glass substrates may be laminated together with a polymer based layer of a material such as PVB, and the solar control coating (e.g., low emissivity or low-E coating) is provided on the interior surface of one of the glass substrates adjacent the polymer based layer. In certain example embodiments of this invention, the solar control coating (e.g., low-E coating) includes either a single-silver stack or a double-silver stack, although this invention is not so limited in all instances (e.g., single silver stacks and other layer stacks may also be used in accordance with certain embodiments of this invention).

In certain example embodiments of this invention, an infrared (IR) reflecting layer(s) (e.g., see Ag inclusive layer 9 and/or 19 discussed below) is ion beam treated using at least ions from an inert gas such as argon and/or krypton. It has surprisingly been found that if the ion treatment is performed in a suitable manner, this causes (a) the electrical resistance of the IR reflecting layer(s) to decrease compared to if the ion beam treatment was not performed, thereby improving IR reflecting characteristics thereof, (b) emittance (e.g., normal type of emittance) of the layer to decrease compared to if the ion beam treatment was not performed, and/or (c) durability of the coated article to improve.

Moreover, in certain example embodiments of this invention, it has unexpectedly been found that ion beam treatment of an IR reflecting layer (e.g., 9 and/or 19) of a material such as Ag, Au or the like causes the stress of the layer to change from tensile to compressive. IR reflecting layers deposited by only sputtering typically have tensile stress. However, the use of ion beam treatment in a suitable manner has surprisingly been found to cause the stress of an IR reflecting layer(s) to be compressive. In this regard, it has been found that the compressive nature of the stress of the IR reflecting layer(s) can function to improve durability (chemical and/or mechanical) of the coated article. Moreover, it has also been found that such ion beam treatment also reduces electrical resistance and/or emittance of the coated article (i.e., of the IR reflecting layer(s) in particular) thereby improving solar control properties thereof.

Accordingly, suitable ion beam treating of an IR reflecting layer(s) has been found in certain example embodiments of this invention to achieve a remarkable combination of: (i) improved resistance and/or emittance of the IR reflecting layer, (ii) improved solar control characteristics of the coated article such as IR blocking, and (iii) improved durability of the coated article. With respect to durability, an example is that the coating is less likely to quickly corrode when exposed to environmental conditions such as high temperatures, high humidity, and so forth.

In certain example embodiments of this invention, a technique knows as IBAD may be used in ion beam treating an IR reflecting layer(s) (e.g., see FIGS. 1-7). However, in other example embodiments of this invention, a technique referred to as "peening" may be used to ion beam treat an IR reflecting layer(s) (e.g., see FIGS. 3-5 and 8-9). In peening embodiments, the ion beam treatment is performed after the IR reflecting layer has been originally deposited by sputter-deposition or the like. In certain IBAD embodiments, sputtering and ion beam treatment may take place at the same time for layer formation and/or treatment. In certain example, instances, IBAD and peening embodiments may be combined.

Figure 2A:
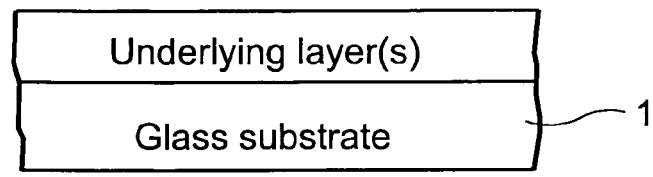
FIGS. 2(a) to 2(c) are cross sectional views illustrating various stages in manufacturing a coated article according to an example embodiment of this invention.
Figure 2B:
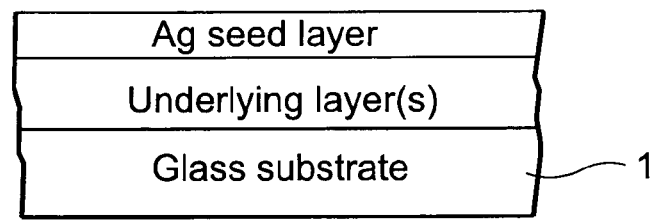
Figure 2C:
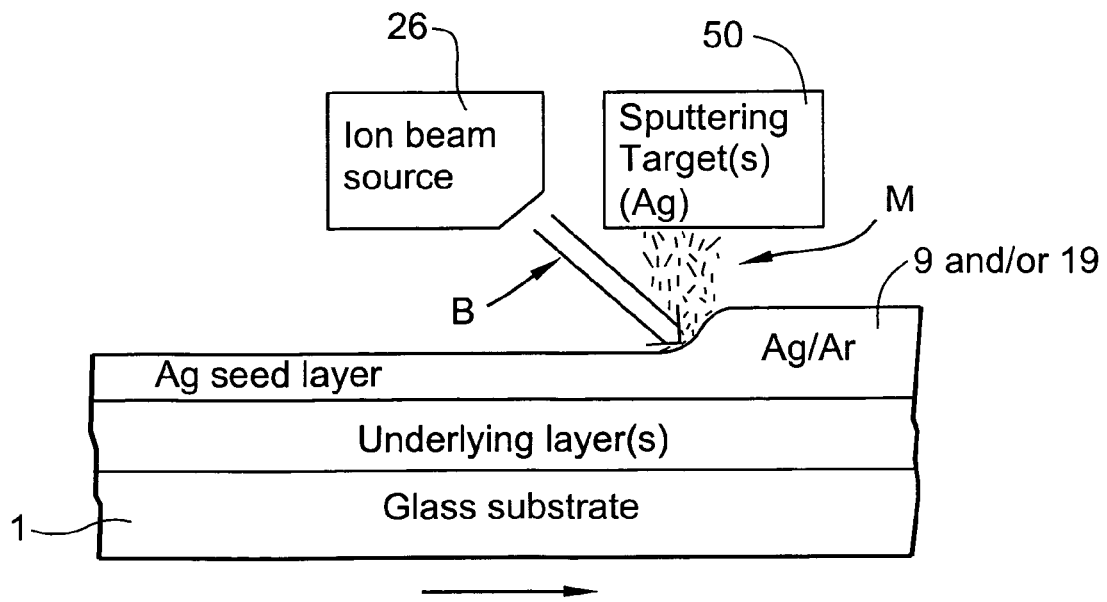
Figure 3:
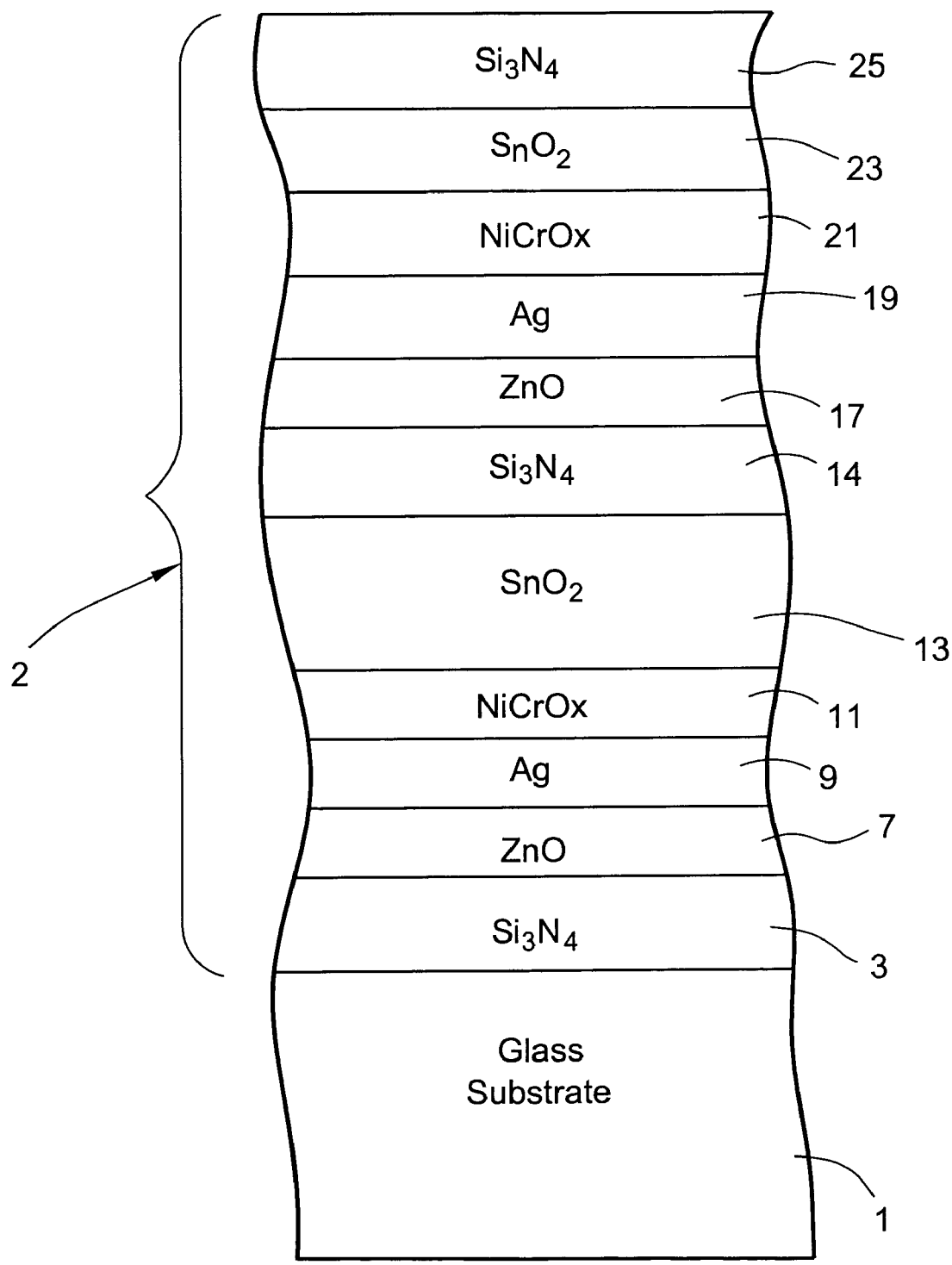
FIG. 3 is a cross sectional view of a coated article according to an example embodiment of this invention.

Referring to FIGS. 1-3, in certain example embodiments of this invention, an IR reflecting layer (9 and/or 19) may be formed in the following manner. At least one underlying layer is formed on glass substrate 1 via sputtering or the like as shown in FIG. 2(*a*) (see step S1 in FIG. 1). In FIG. 3, the underlying layers would be layers 3 and 7. Then, a seed layer (e.g., of Ag or the like) is formed on the substrate over the underlying layer(s) by sputtering at least one target of Ag or the like as shown in FIG. 2(*b*) (see S2 in FIG. 1). The seed layer is typically metallic, or substantially metallic, and of a material such as Ag, Au or the like. However, in certain embodiments, the seed layer may consist essentially of Ag and/or Au, and be doped with small amounts of other materials such as oxygen or metal(s). Preferably, the seed layer is substantially of the same material (e.g., Ag) as the ultimate IR reflecting layer (9 and/or 19) being formed. Since the seed layer is formed by sputtering, the seed layer will typically be formed in a manner so as to have tensile stress. In certain example embodiments of this invention, the Ag seed layer is sputtered onto the substrate so as to have a thickness of from about 10 to 100 Å, more preferably from about 30 to 80 Å, even more preferably from about 40 to 70 Å, with an example thickness being about 60 Å.

Then, after sputtering of the seed layer on the substrate as shown in FIG. 2(*b*), ion beam assisted deposition (IBAD) is used to form an additional or remainder portion of the IR reflecting layer (9 and/or 19) as shown in FIG. 2(*c*) (see S3 in FIG. 1). FIGS. 2(*c*) and 6 illustrate that in the IBAD type of ion beam treatment/formation, both an ion beam source(s) 26 and a sputtering device including a sputtering target(s) 50 are used. An ion beam B from the ion beam source 26 intersects with the material M sputtered from the sputtering target(s) 50 proximate the surface where the additional or remainder portion of the IR reflecting layer is being grown, so that the additional or remainder portion of the IR reflecting layer is grown/formed by a simultaneous combination of both the ion beam and sputtering. In certain example embodiments of this invention, a first Ag sputtering target is used for sputter-depositing the seed layer, and a second Ag sputtering target spaced apart from the first target is used to deposit/form the additional or remainder portion of the IR reflecting layer via IBAD.

Figure 6:
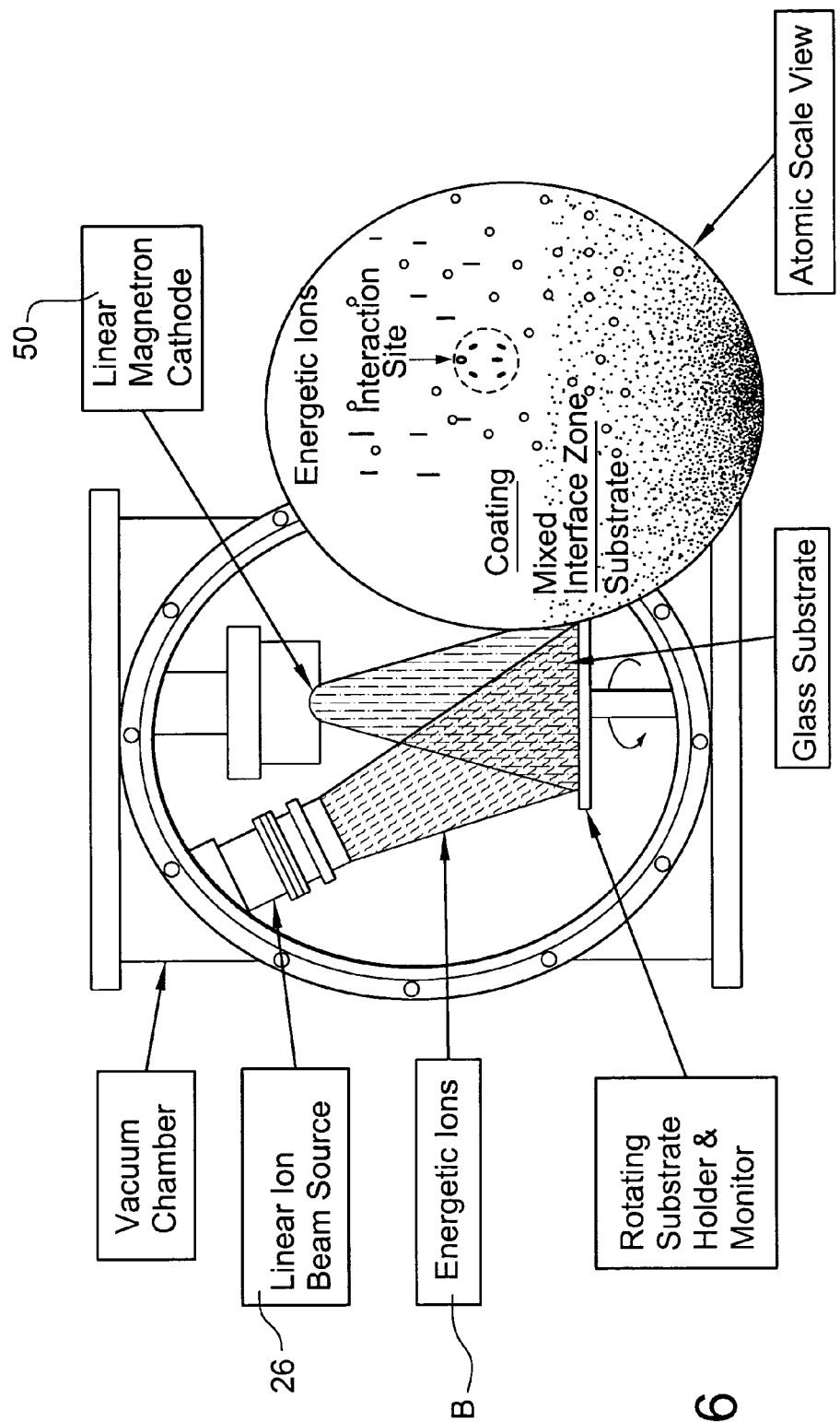
FIG. 6 is a diagram illustrating ion beam assisted deposition (IBAD) of a layer according to an example embodiment of this invention; this may be used to ion beam treat any layer mentioned herein that can be ion beam treated.

The use of the seed layer and then the subsequent formation of the additional or remaining portion of the IR reflecting layer (9 and/or 19) using IBAD as shown in FIGS. 1-2 and 6 results in an IR reflecting layer that is graded with respect to argon content. In particular, an upper portion of the IR reflecting layer includes a higher Ar concentration than does a lower portion of the IR reflecting layer. This is because Ar ions do not impinge upon the layer during formation thereof until after the seed layer has been formed. Accordingly, the upper portion of the resulting IR reflecting layer includes a higher Ar content than does the lower portion of the layer. This grading would be for content of another element (e.g., Kr and/or Xe) if the other element(s) was used instead of or in place of Ar in the ion beam in alternative embodiments of this invention. In certain example embodiments, the upper portion of the IR reflecting layer (9 and/or 19) has an argon (or other inert element) concentration at least 10% higher than that of the lower portion of the IR reflecting layer, more preferably at least 20% higher, and most preferably at least 30% higher. The "lower portion" is merely some arbitrarily selected portion of the layer at least partially below the center point of the layer, where the "upper portion" of the layer is some arbitrarily selected portion of the layer at least partially above the center of the layer. In certain example instances, the upper portion may be the upper 20 Å of the IR reflecting layer, and the lower portion may be the lower 60 Å (or 20 Å) of the layer.

Thus, the resulting IR reflecting layer (9 and/or 19) shown in FIGS. 2(*c*) and 3 is made up of the combination of the Ag inclusive seed layer and the Ag inclusive layer formed immediately thereover via IBAD. Note that the seed layer will have been modified by the IBAD process, with Ar ions having been injected thereinto and/or its stress having been changed from tensile to compressive. As explained above, it has surprisingly been found that: (a) the IBAD formation of the Ag layer portion of the seed layer in a suitable manner causes the stress of the seed layer to change from tensile to compressive in the final IR reflecting layer 9 and/or 19; and (b) the IBAD formation of the additional Ag inclusive layer portion immediately over and contacting the seed layer results in an IR reflecting layer having improved electrical resistance properties and thus improved solar control functionality.

Then, following formation of the IR reflecting layer 9 and/or 19, additional layer(s) are deposited on the substrate 1 over at least the IR reflecting layer (see step S4 in FIG. 1). These additional layer in the example FIG. 3 embodiment may be layers 11-25 and/or 21-25.

In certain example embodiments, the resulting IR reflecting layer 9 and/or 19 has a thickness of from about 60 to 200 Å, more preferably from about 80 to 170 Å, even more preferably from about 100 to 140 Å, with an example being about 120 Å. Moreover, in certain example embodiments of this invention, the IR reflecting layer(s) 9 and/or 19 are substantially free of oxygen. For example, the IR reflecting layer(s) 9 and/or 19 include from about 0-10% oxygen, more preferably from about 0-5% oxygen, even more preferably from about 0-2% oxygen and most preferably from 0-1% oxygen. This substantially free of oxygen characteristic may be achieved throughout the entire thickness of the layer, or alternative in at least a central portion of the layer no located immediately adjacent the contact layers.

In certain example embodiments of this invention, the ion beam includes at least ions from an inert gas used in the ion source 26. For example, the ion beam B may be of or include Ar+ ions if only Ar gas is used in the ion source 26. In certain example embodiments of this invention, the ion beam is substantially free of oxygen ions and the gas used in the ion source 26 is substantially free of oxygen. Thus, the ion beam B and gas introduced into the ion source 26 include from 0-10% oxygen, more preferably from 0-5% oxygen, even more preferably from 0-2% oxygen, and most preferably from 0-1% oxygen (0% oxygen may be preferred in many instances). The ion beam is also substantially free of nitrogen ions in certain example embodiments of this invention.

Moreover, in certain example embodiments of this invention, in forming the additional or remainder portion of the IR reflecting layer(s) 9 and/or 19 via IBAD, an ion energy of from about 150 to 700 eV per $Ar^+$ ion, more preferably of from about 200 to 600 eV per $Ar^+$ ion, and most preferably about 500 eV per $Ar^+$ ion is used. As an example, when only Ar gas is used in the ion source 26, an anode/cathode voltage of from about 300 to 1,400 V may be used at the source 26, more preferably from about 400 to 1,200 V, and most preferably about 1,000 V.

FIG. 3 is a side cross sectional view of a coated article according to an example non-limiting embodiment of this invention. The coated article includes substrate 1 (e.g., clear, green, bronze, or blue-green glass substrate from about 1.0 to 10.0 mm thick, more preferably from about 1.0 mm to 3.5 mm thick), and a low-E coating (or layer system) 2 provided on the substrate 1 either directly or indirectly. The coating (or layer system) 2 includes, in this example embodiment: dielectric silicon nitride layer 3 (which may be ion beam treated) which may be of $Si_3N_4$ or of any other suitable stoichiometry of silicon nitride in different embodiments of this invention, first lower contact layer 7 (which contacts IR reflecting layer 9), first conductive and preferably metallic or substantially metallic infrared (IR) reflecting layer 9, first upper contact layer 11 (which contacts layer 9), dielectric layer 13 (which may be deposited in one or multiple steps in different embodiments of this invention), another silicon nitride layer 14, second lower contact layer 17 (which contacts IR reflecting layer 19), second conductive and preferably metallic IR reflecting layer 19, second upper contact layer 21 (which contacts layer 19), dielectric layer 23, and finally dielectric silicon nitride overcoat layer 25 (which may be ion beam treated). The "contact" layers 7, 11, 17 and 21 each contact at least one IR reflecting layer. The aforesaid layers 3-25 make up low-E (i.e., low emissivity) coating 2 which is provided on glass or plastic substrate 1. Silicon nitride layer 25 is the outermost layer of the coating 2.

In embodiments herein discussing ion beam treatment of IR reflecting layer, the ion beam treatment/formation may be performed with respect to Ag layers 9 and/or 19.

In monolithic instances, the coated article includes only one glass substrate 1 as illustrated in FIG. 3. However, monolithic coated articles herein may be used in devices such as laminated vehicle windshields, IG window units, and the like. A laminated vehicle window such as a windshield includes first and second glass substrates laminated to one another via a polymer based interlayer (e.g., see U.S. Pat. No. 6,686,050, the disclosure of which is incorporated herein by reference). One of these substrates of the laminate may support coating 2 on an interior surface thereof in certain example embodiments. As for IG window units, an IG window unit may include two spaced apart substrates 1. An example IG window unit is illustrated and described, for example, in U.S. Pat. No. 6,632,491, the disclosure of which is hereby incorporated herein by reference. An example IG window unit may include, for example, the coated glass substrate 1 shown in FIG. 3 coupled to another glass substrate via spacer(s), sealant(s) or the like with a gap being defined therebetween. This gap between the substrates in IG unit embodiments may in certain instances be filled with a gas such as argon (Ar). An example IG unit may comprise a pair of spaced apart clear glass substrates each about 4 mm thick one of which is coated with a coating herein in certain example instances, where the gap between the substrates may be from about 5 to 30 mm, more preferably from about 10 to 20 mm, and most preferably about 16 mm. In certain example instances, the coating 2 may be provided on the interior surface of either substrate facing the gap.

Example details relating to layers 3, 7, 9, 11, 13, 14, 17, 19, 21, 23 and 25 of the FIG. 3 coating are discussed in U.S. patent application Ser. No. 10/800,012, the disclosure of which is hereby incorporated herein by reference. For example, dielectric layers 3 and 14 may be of or include silicon nitride in certain embodiments of this invention. Silicon nitride layers 3 and 14 may, among other things, improve heat-treatability of the coated articles, e.g., such as thermal tempering or the like. The silicon nitride of layers 3 and/or 14 may b& of the stoichiometric type $(Si_3N_4)$ type, nitrogen doped type due to ion beam treatment thereof as discussed herein, or alternatively of the Si-rich type in different embodiments of this invention. Any and/or all of the silicon nitride layers discussed herein may be doped with other materials such as stainless steel or aluminum in certain example embodiments of this invention. For example, any and/or all silicon nitride layers discussed herein may optionally include from about 0-15% aluminum, more preferably from about 1 to 10% aluminum, most preferably from 1-4% aluminum, in certain example embodiments of this invention. The silicon nitride may be deposited by sputtering a target of Si or SiAl in certain embodiments of this invention. Moreover, silicon nitride layer 3 may be ion beam treated in any manner discussed herein (e.g., with at least nitrogen ions via IBAD) in order to reduce sodium migration from the glass substrate toward the IR reflecting layer(s) during HT.

Infrared (IR) reflecting layers 9 and 19 are preferably substantially or entirely metallic and/or conductive, and may comprise or consist essentially of silver (Ag), gold, or any other suitable IR reflecting material. One or both of IR reflecting layers 9 and/or 19 may be formed by the ion beam inclusive techniques as discussed herein with respect to FIGS. 1-2. IR reflecting layers 9 and 19 help allow the coating to have low-E and/or good solar control characteristics. The IR reflecting layers may, however, be slightly oxidized in certain embodiments of this invention.

Dielectric layer 13 may be of or include tin oxide in certain example embodiments of this invention. However, as with other layers herein, other materials may be used in different instances. Lower contact layers 7 and/or 17 in certain embodiments of this invention are of or include zinc oxide (e.g., ZnO). The zinc oxide of layer(s) 7, 17 may contain other materials as well such as Al (e.g., to form $ZnAlO_x$). For example, in certain example embodiments of this invention, one or more of zinc oxide layers 7, 17 may be doped with from about 1 to 10% Al, more preferably from about 1 to 5% Al, and most preferably about 2 to 4% Al. The use of zinc oxide 7, 17 under the silver 9, 19 allows for an excellent quality of silver to be achieved. Upper contact layers 11 and/or 21 may be of or include NiCr, $NiCrO_x$ and/or the like in different example embodiments of this invention.

Dielectric layer 23 may be of or include tin oxide in certain example embodiments of this invention. However, layer 23 is optional and need not be provided in certain example embodiments of this invention. Silicon nitride overcoat layer 25 may be initially deposited by sputtering or IBAD, and may be ion beam treated in any manner discussed herein.

Other layer(s) below or above the illustrated coating may also be provided. Thus, while the layer system or coating is "on" or "supported by" substrate 1 (directly or indirectly), other layer(s) may be provided therebetween. Thus, for example, the coating of FIG. 3 may be considered "on" and "supported by" the substrate 1 even if other layer(s) are provided between layer 3 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

Figure 7:
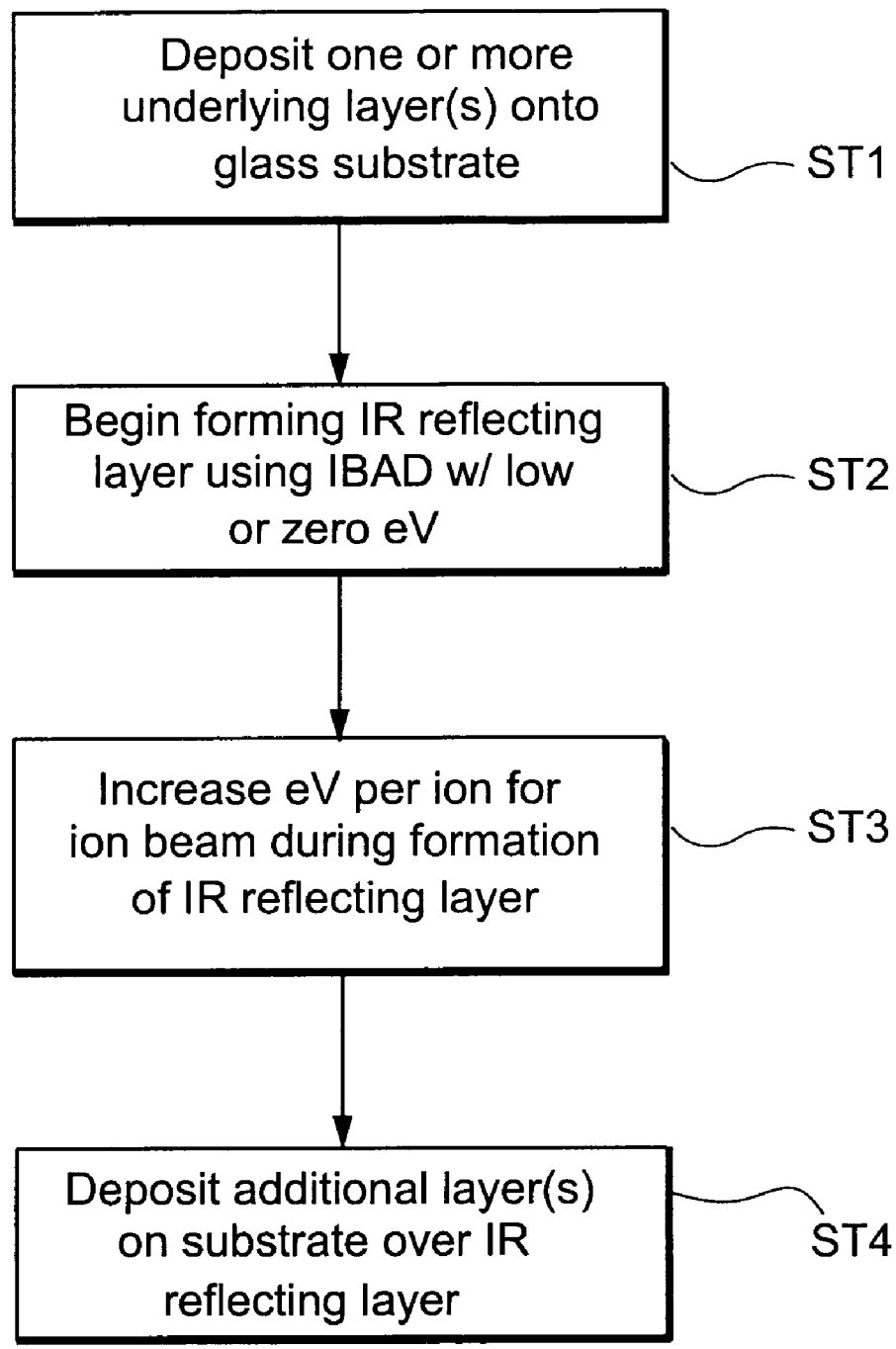
FIG. 7 is a flowchart illustrating certain steps carried out in making a coated article according to another example embodiment of this invention.

FIG. 7 is a flowchart illustrating how an IR reflecting layer 9 and/or 19 may be formed according to another example embodiment of this invention. In the FIG. 7 embodiment, an IR reflecting layer may be formed entirely using IBAD. At the beginning of the IR reflecting layer formation using IBAD, the volts applied to the ion source are low or zero so that the ion beam either is not formed or is of a low energy type (i.e., low eV per ion). Then, during formation of the IR reflecting layer after at least some of the layer has been deposited, the voltage at the ion source is increased so as to increase the eV per ion in the ion beam. In other words, the ion energy is increased, either progressively or in a step-like manner, during formation of the IR reflecting layer. This prevents or reduces damage to the lower portion of the IR reflecting layer and/or to the layer under the same since a low energy ion beam is used to form the initial part of the IR reflecting layer, and yet achieves the advantages discussed herein with respect to the final IR reflecting layer since a higher energy is used to form at least the upper portion of the IR reflecting layer.

Referring in detail to FIG. 7, one or more underlying layer(s) are deposited on substrate 1 (ST1). This step is similar to step S1 in the FIG. 1 embodiment. Then, during the deposition of the first portion of the IR reflecting layer (9 and/or 19), IBAD is used but the ion beam is characterized by a relatively low energy (ST2). For example, in ST2 during the formation of the initial portion of the IR reflecting layer, an ion energy of from about 0 to 200 eV per $Ar^+$ ion, more preferably from about 1 to 150 eV, more preferably from about 5 to 100 eV per $Ar^+$ ion is used. Again, other inert gas(es) may be used instead of or in addition to argon. Then, after part of the IR reflecting layer has been formed, the ion energy is increased for forming the additional or remainder portion of the IR reflecting layer(s) 9 and/or 19 via IBAD (ST3). In certain example embodiments, the ion energy is increased to an ion energy of from about 150 to 700 eV per $Ar^+$ ion, more preferably of from about 200 to 600 eV per $Ar^+$ ion, and most preferably about 500 eV per $Ar^+$ ion in ST3. In certain example embodiments of this invention, the ion energy is increased by at least about 10% in step ST3, more preferably at least about 25%, even more preferably at least about 50%, sometimes at least about 100%. After the additional and/or remainder portion of the IR reflecting layer has been formed using the higher ion energy, additional layer(s) are deposited/formed on the substrate 1 over at least the IR reflecting layer (ST4).

While various thicknesses and materials may be used in layers in different embodiments of this invention, example thicknesses and materials for the respective layers on the glass substrate 1 in the FIG. 3 embodiment are as follows, from the glass substrate 1 outwardly. One or both of the IR reflecting layers 9 and/or 19 are formed/deposited using at least IBAD according to any of the embodiments discussed herein.

Example Materials/Thicknesses; FIG. 3 Embodiment

| Layer | Preferred Range (Å) | More Preferred (Å) | Example (Å) |
|---|---|---|---|
| Glass (1-10 mm thick) | | | |
| $Si_3N_4$ (layer 3) | 40-450 Å | 70-250 Å | 100 |
| $ZnO_x$ (layer 7) | 10-300Å | 40-150Å | 100 |
| Ag (layer 9) (IBAD) | 50-250Å | 80-120Å | 98 |
| $NiCrO_x$ (layer 11) | 10-100Å | 30-45Å | 35 |
| $SnO_2$ (layer 13) | 0-1,000 Å | 350-630 Å | 570 |
| $Si_xN_y$ (layer 14) | 50-450Å | 90-150Å | 120 |
| $ZnO_x$ (layer 17) | 10-300Å | 40-150Å | 95 |
| Ag (layer 19) (IBAD) | 50-250Å | 80-220Å | 96 |
| $NiCrO_x$ (layer 21) | 10-100Å | 30-45Å | 35 |
| $SnO_2$ (layer 23) | 0-750 Å | 150-300 Å | 200 |
| $Si_3N_4$ (layer 25) | 10-750Å | 100-320 Å | 180 |

Optionally, one or both of silicon nitride inclusive layers 3 and/or 25 may be ion beam treated in certain example embodiments of this invention. Ion beam treatment of silicon nitride inclusive layer 3 has surprisingly been found to reduce sodium migration during optional heat treatment thereby improving coating characteristics, whereas ion beam treatment of silicon nitride overcoat layer 25 has been found to improve durability of the resulting coated article.

In certain IBAD embodiments, if the appropriate ion energy is used for a given material, the compressive stress of the IBAD-deposited layer 3, 9, 19, and/or 25 may be from about 50 MPa to 2 GPa, more preferably from about 50 MPa to 1 GPA, and most preferably from about 100 MPa to 800 MPa. Such IBAD techniques may be used in conjunction with IR reflecting layer(s), base layer(s), overcoat layer(s) or any other layer herein which may be ion beam treated.

In various embodiments discussed herein, the ion beam B may be a focused ion beam, a collimated ion beam, or a diffused ion beam in different embodiments of this invention.

Coated articles according to different embodiments of this invention may or may not be heat treated (HT) in different instances. The terms "heat treatment" and "heat treating" as used herein mean heating the article to a temperature sufficient to achieve thermal tempering, heat bending, and/or heat strengthening of the glass inclusive article. This definition includes, for example, heating a coated article in an oven or furnace at a temperature of least about 580 degrees C., more preferably at least about 600 degrees C., for a sufficient period to allow tempering, bending, and/or heat strengthening. In certain instances, the HT may be for at least about 4 or 5 minutes. In certain example embodiments of this invention, ion beam treated silicon nitride undercoat and/or overcoat layers are advantageous in that they change less with regard to color and/or transmission during optional heat treatment; this can improve interlayer adhesion and thus durability of the final product; and ion beam treated lower silicon nitride inclusive layers aid in reduction of sodium migration during HT.

It is noted that any of the silicon nitride layers 3 and/or 25 to be ion beam treated herein may be initially sputter deposited in any suitable stoichiometric form including but not limited to $Si_3N_4$ or a Si-rich type of silicon nitride. Example Si-rich types of silicon nitride are discussed in U.S. 2002/0064662 (incorporated herein by reference), and any Si-rich layer discussed therein may be initially sputter-deposited herein for any suitable silicon nitride layer. Also, silicon nitride layers herein may of course be doped with aluminum (e.g., 1-10%) or the like in certain example embodiments of this invention. It has also been found that ion beam treating of a layer comprising silicon nitride (3 and/or 25) increases the hardness of such a layer according to certain example embodiments of this invention (e.g., via IBAD or peening). A layer comprising silicon nitride when conventionally sputtered typically has a hardness of from 10-14 GPa. In certain example embodiments of this invention however, when ion beam treated, the silicon nitride layer (3 and/or 25) realizes a hardness of at least 20 GPa, more preferably of at least 22 GPa, and most preferably of at least 24 GPa.

In certain example embodiments of this invention, one or both of NiCr or $NiCrO_x$ layers 11 and/or 21 may be ion beam treated using at least oxygen ions in order to oxidation grade as described in U.S. Ser. No. 10/847,672, filed May 18, 2004, the entire disclosure of which is hereby incorporated herein by reference.

Figure 4:
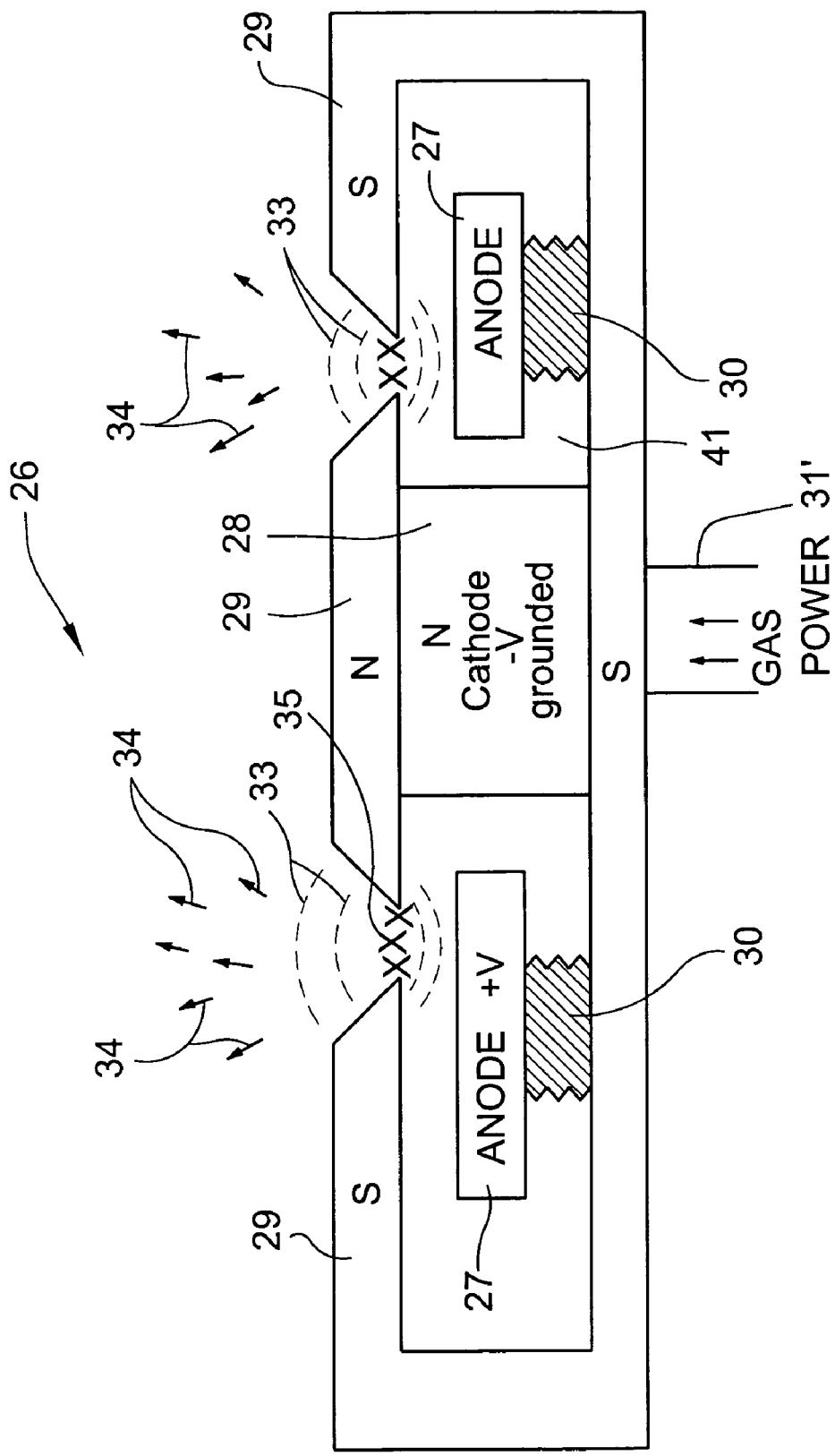
FIG. 4 is a cross sectional view of an example ion source that may be used to ion beam treat layers according to example embodiments of this invention.
Figure 5:
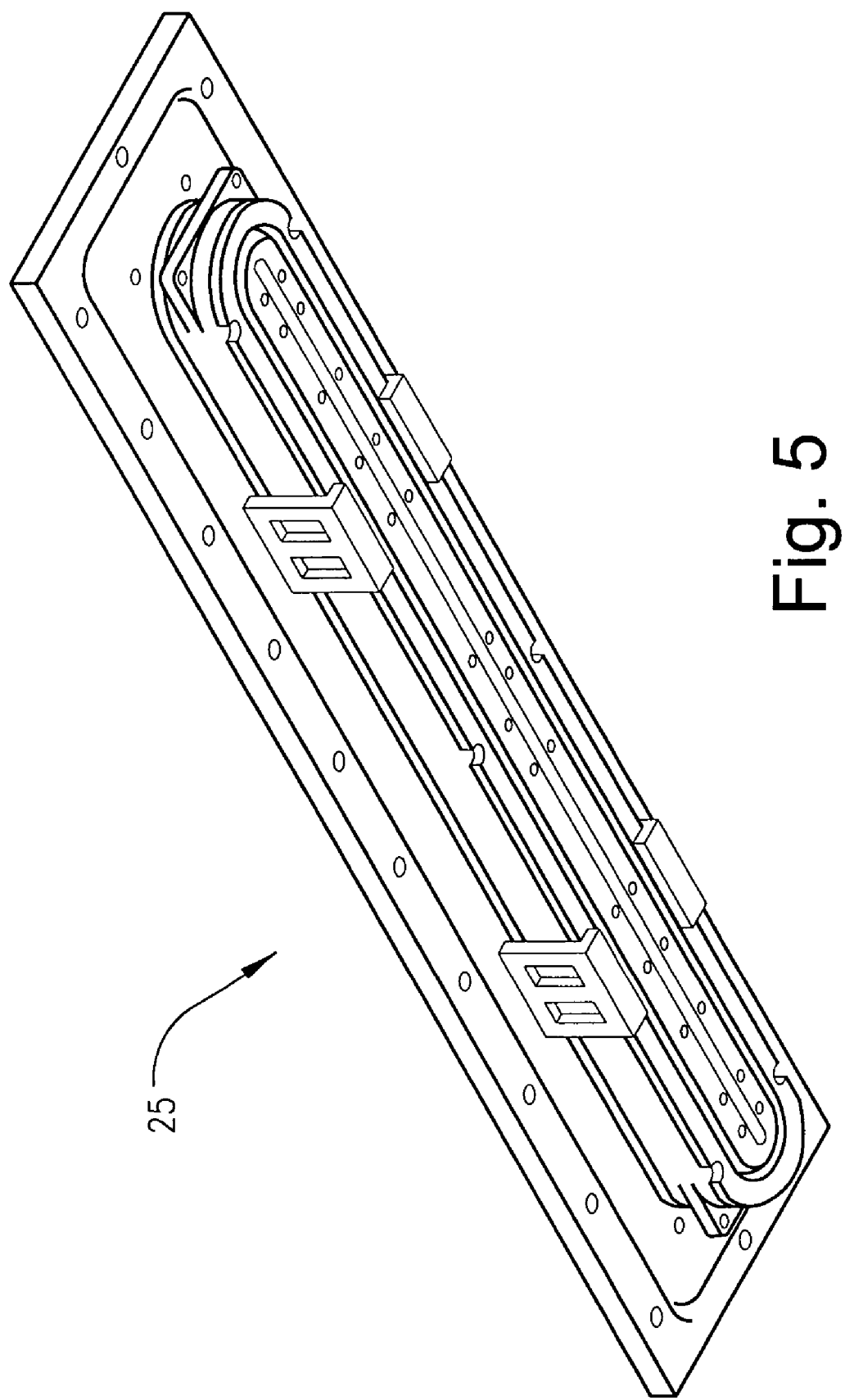
FIG. 5 is a perspective view of the ion source of FIG. 4.

FIGS. 4-5 illustrate an exemplary linear or direct ion beam source 26 which may be used to form the additional or remainder portion of an IR reflecting layer (9 and/or 19) as discussed above in connection with FIGS. 1-3, or to ion beam treat layer(s) 3 and/or 25 with at least nitrogen ions in certain example embodiments of this invention (via peening or IBAD). Ion beam source (or ion source) 26 includes gas/power inlet 31, racetrack-shaped anode 27, grounded cathode magnet portion 28, magnet poles, and insulators 30. An electric gap is defined between the anode 27 and the cathode 29. A 3 kV or any other suitable DC power supply may be used for source 26 in some embodiments. The gas(es) discussed herein for use in the ion source during the ion beam treatment may be introduced into the source via gas inlet 31, or via any other suitable location. Ion beam source 26 is based upon a known gridless ion source design. The linear source may include a linear shell (which is the cathode and grounded) inside of which lies a concentric anode (which is at a positive potential). This geometry of cathode-anode and magnetic field 33 may give rise to a close drift condition. Feedstock gases (e.g., nitrogen, argon, a mixture of nitrogen and argon, etc.) may be fed through the cavity 41 between the anode 27 and cathode 29. The electrical energy between the anode and cathode cracks the gas to produce a plasma within the source. The ions 34 (e.g., nitrogen ions) are expelled out (e.g., due to the nitrogen gas in the source) and directed toward the layer to be ion beam treated/formed in the form of an ion beam. The ion beam may be diffused, collimated, or focused. Example ions 34 in beam (B) are shown in FIG. 4.

A linear source as long as 0.5 to 4 meters may be made and used in certain example instances, although sources of different lengths are anticipated in different embodiments of this invention. Electron layer 35 is shown in FIG. 4 and completes the circuit thereby permitting the ion beam source to function properly. Example but non-limiting ion beam sources that may be used are disclosed in U.S. Pat. Nos. 6,303,226, 6,359,388, and/or 2004/0067363, all of which are hereby incorporated herein by reference.

In certain example embodiments of this invention, coated articles herein having two IR reflecting layer 9, 19 may have the following optical and solar characteristics when measured monolithically (before any optional HT). The sheet resistances ($R_s$) herein take into account all IR reflecting layers (e.g., silver layers 9, 19).

| Optical/Solar Characteristics (Monolithic double-Ag; pre-HT) | | | |
|---|---|---|---|
| Characteristic | General | More Preferred | Most Preferred |
| $R_s$ (ohms/sq.): | <=5.0 | <=3.5 | <=2.5 |
| $E_n$: | <=0.08 | <=0.03 | <=0.025 |
| $T_{vis}$ (Ill. C 2°): | >=70% | >=75% | >=75.5% |

In certain example embodiments, coated articles herein may have the following characteristics, measured monolithically for example, after heat treatment (HT):

| Optical/Solar Characteristics (Monolithic double-Ag; post-HT) | | | |
|---|---|---|---|
| Characteristic | General | More Preferred | Most Preferred |
| $R_s$ (ohms/sq.): | <=5.0 | <=3.0 | <=2.0 |
| $E_n$: | <=0.07 | <=0.03 | <=0.0025 |
| $T_{vis}$ (Ill. C 2°): | >=70% | >=75% | >=80% |
| Haze: | <=0.40 | <=0.35 | <=0.30 |

It is noted, however, that for coatings having only one IR reflecting layer, the sheet resistance and emissivity values will of course be higher.

Moreover, in certain example laminated embodiments of this invention, coated articles herein which have been heat treated to an extent sufficient for tempering and/or heat bending, and which have been laminated to another glass substrate, may have the following optical/solar characteristics:

| Optical/Solar Characteristics (Laminated double-Ag; post-HT) | | | |
|---|---|---|---|
| Characteristic | General | More Preferred | Most Preferred |
| $R_s$ (ohms/sq.): | <=5.0 | <=3.0 | <=2.0 |
| $E_n$: | <=0.07 | <=0.03 | <=0.025 |
| $T_{vis}$ (Ill. D65 10°): | >=70% | >=75% | >=77% |
| Haze: | <=0.45 | <=0.40 | <=0.36 |

Moreover, coated articles including coatings according to certain example embodiments of this invention have the following optical characteristics (e.g., when the coating(s) is provided on a clear soda lime silica glass substrate 1 from 1 to 10 mm thick; e.g., 2.1 mm may be used for a glass substrate reference thickness in certain example non-limiting instances) (laminated).

Example Optical Characteristics (Laminated double-Ag; post-HT)

| Characteristic | General | More Preferred |
|---|---|---|
| $T_{vis}$ (or TY)(Ill. D65 10°): | >=75% | >=77% |
| $a^*_t$ (Ill. D65 10°): | −6 to +1.0 | −4 to 0.0 |
| $b^*_t$ (Ill. D65 10°): | −2.0 to +8.0 | 0.0 to 4.0 |
| $L^*$ (Ill. D65 10°): | 88-95 | 90-95 |
| $R_fY$ (Ill. C, 2 deg.): | 1 to 12% | 1 to 10% |
| $a^*_f$ (Ill. C, 2°): | −5.0 to +2.0 | −3.5 to +0.5 |
| $b^*_f$ (Ill. C, 2°): | −14.0 to +10.0 | −10.0 to 0 |
| $L^*$ (Ill. C 2°): | 30-40 | 33-38 |
| $R_gY$ (Ill. C, 2 deg.): | 1 to 12% | 1 to 10% |
| $a^*_g$ (Ill. C, 2°): | −5.0 to +2.0 | −2 to +2.0 |
| $b^*_g$ (Ill. C, 2°): | −14.0 to +10.0 | −11.0 to 0 |
| $L^*$ (Ill. C 2°): | 30-40 | 33-38 |

The following examples are provided for purposes of example only and are not intended to be limiting.

EXAMPLES

In Example 1, an IR reflecting layer of Ag was formed on a 100 Å thick ZnO layer. In forming the IR reflecting layer, an Ag seed layer about 60 Å thick was first deposited via sputtering, and thereafter the remainder of the IR reflecting layer was formed using IBAD. The IBAD, at room temperature, utilized a silver sputtering target and an ion beam of argon ions, where the average ion energy was from about 200 to 250 eV per $Ar^+$ ion.

Comparative Example 1 was the same as Example 1 above, except that the entire Ag IR reflecting layer was formed using only sputtering (no IBAD was used). The results comparing Example 1 and Comparative Example are set forth below.

|  | Ex. 1 | Comparative Ex. 1 |
|---|---|---|
| Ag Thickness (total): | 120 Å | 120 Å |
| Sheet Resistance ($R_s$, ohms/square): | 3.0 | 3.8 |
| IBAD: | yes | no |
| Ion Energy per $Ar^+$ ion: | 200-250 eV | 0 |
| Stress Type: | compressive | tensile |

It can be seen from the above that the use of IBAD (see Example 1) in helping form the IR reflecting layer resulted in a significantly improved (i.e., lower) sheet resistance of the IR reflecting layer. Indeed, the sheet resistance ($R_s$) was about 21% lower in Example 1 where IBAD was used, than in Comparative Example 1 where only sputtering was used to form the IR reflecting layer (3.8−3.0=0.8; and 0.8/3.8=21%). In certain example embodiments of this invention, the use of IBAD causes the sheet resistance ($R_s$) to be at least about 5% lower than if ion beam treatment such as IBAD had not been used, more preferably at least about 10% lower, sometimes at least 15% lower, and even at least 20% lower in certain instances. Moreover, the compressive stress of the IR reflecting layer of Example 1 resulted in significantly improved durability compared to Comparative Example 1, since Comparative Example 1 had tensile stress due to its deposition using only sputtering.

In Example 2, an IR reflecting layer of Ag about 139 Å thick was formed on a 600 Å thick ZnO layer. In forming the IR reflecting layer, an Ag seed layer portion about 60 Å thick was first deposited via sputtering, and thereafter the remainder of the IR reflecting layer was formed using IBAD. The IBAD, at room temperature, utilized a silver sputtering target and an ion beam of argon ions, where the average ion energy was about 250 eV per $Ar^+$ ion.

Comparative Example 2 was the same as Example 2, except that the entire Ag IR reflecting layer was formed using sputtering without IBAD.

Comparative Example 3 did not include a seed layer, and instead used IBAD at the same ion energy to deposit the entire Ag IR reflecting layer.

|  | Ex. 2 | Comp Ex. 2 | Comp Ex. 3 |
|---|---|---|---|
| Ag Thickness (total): | 139 Å | 153 Å | 144 Å |
| Bulk Resistivity [$\mu\Omega$ cm]: | 4.6 | 4.8 | 4.9 |
| Seed layer | yes | no | no |
| IBAD: | yes | no | yes |
| Ion Energy per $Ar^+$ ion: | 250 eV | 0 | 250 eV |
| Stress Type: | compressive | tensile | compressive |

It can be seen from the above that the use of IBAD (see Example 2) in helping form the IR reflecting layer resulted in an improved (i.e., lower) resistance of the IR reflecting layer compared to only sputtering in Comparative Example 2. It is noted that the bulk resistance (BR) in the chart above can be converted to sheet resistance as follows: $R_s$=BR/d, where "d" is the thickness of the IR reflecting layer. Moreover, the compressive stress of the IR reflecting layer of Example 2 resulted in significantly improved durability compared to Comparative Example 2, since Comparative Example 2 had tensile stress due to its deposition using only sputtering.

The comparison between Example 2 and Comparative Example 3 illustrates the benefit of the Ag seed layer. In particular, when the seed layer was not present and the same rather high ion energy was used to deposit the entire Ag IR reflecting layer via IBAD, the electrical resistivity actually was worse (higher) than with only sputtering (compare Comparative Example 3 with Comparative Example 2). It is believed that this occurred since the high ion energy used at the beginning of forming the IR reflecting layer caused significant ion mixing with the underlying ZnO and thereby damaged the structure of the resulting IR reflecting layer. This illustrates the advantage of the FIG. 7 embodiment where IBAD can be used to form the entire IR reflecting layer, except that ion energy is increased during deposition of the layer so that such damage to lower portions of the layer does not occur or is reduced.

The following examples relate to ion beam treatment (either via IBAD or peening) of silicon nitride layer (e.g., layers 3 and/or 25 for example and without limitation).

Examples 3-5 illustrate example techniques for forming layers 3 and/or 25, or any other suitable layer according to example embodiments of this invention. Examples 3-5 utilized IBAD type of ion beam treatment, and were made and tested as follows. A silicon nitride layer was deposited on a quartz wafer (used for ease of stress testing) using IBAD (e.g., see FIG. 6) under the following conditions in the deposition chamber: pressure of 2.3 mTorr; anode/cathode ion beam source voltage of about 800 V; Ar gas flow in the ion source of 15 sccm; N₂ gas flow in the ion source 26 of 15 sccm; sputtering target of Si doped with about 1% boron; 460 V applied to sputtering cathode; 5.4 sputtering amps used; 60 sccm Ar and 40 sccm N₂ gas flow used for sputtering gas flow; linear line speed of 50 inches/minute; where the quartz wafer substrate was circular in shape and about 0.1 to 0.15 mm thick. The ion beam treatment time for a given area was about 3 seconds.

Example 4 was the same as Example 3, except that the anode/cathode voltage in the ion source was increased to 1,500 V.

Example 5 was the same as Example 3, except that the anode/cathode voltage in the ion source was increased to 3,000 V.

The stress results of Examples 3-5 were as follows, and all realized compressive stress:

| Example | Compressive Stress | Ion Source Anode/Cathode Volts |
|---|---|---|
| 3 | 750 MPa | 800 V |
| 4 | 1.9 GPa | 1,500 V |
| 5 | 1 GPa | 3,000 V |

It can be seen from Examples 3-5 that the compressive stress of the silicon nitride layer realized due to IBAD deposition is a function of ion energy (i.e., which is a function of voltage applied across the anode/cathode of the ion source 26). In particular, 1,500 anode-cathode volts caused the highest compressive stress to be realized, whereas when too much voltage was applied the stress value began moving back toward tensile.

Example 6

Example 6 used post-sputtering peening type of ion beam treatment, and was made and tested as follows. A silicon nitride layer about 425 Å thick was deposited by conventional magnetron-type sputtering using a Si target doped with Al on a substrate. After being sputter-deposited, the silicon nitride layer had a tensile stress of 400 MPa as tested on the quartz wafer. After being sputter-deposited and stress tested, the silicon nitride layer was ion beam treated using an ion source 26 as shown in FIGS. 4-5 under the following conditions: ion energy of 750 eV per N ion; treatment time of about 18 seconds (3 passes at 6 seconds per pass); and N₂ gas used in the ion source. After being ion beam treated, the silicon nitride layer was again tested for stress, and had a tensile stress of only 50 MPa. Thus, the post-sputtering ion beam treatment caused the tensile stress of the silicon nitride layer to drop from 400 MPa down to 50 MPa (a drop of 87.5%).

Example 7

The following hypothetical Example 7 is provided for purposes of example only and without limitation, and uses a 2.1 mm thick clear glass substrates so as to have approximately the layer stack set forth below and shown in FIG. 3. The layer thicknesses are approximations, and are in units of angstroms (Å).

| Layer Stack for Example 7 | |
|---|---|
| Layer | Thickness (Å) |
| Glass Substrate | |
| N-doped Si₃N₄ | 100 |
| ZnAlO$_x$ | 109 |
| Ag | 96 |
| NiCrO$_x$ | 25 |
| SnO₂ | 535 |
| Si$_x$N$_y$ | 126 |
| ZnAlO$_x$ | 115 |
| Ag | 95 |
| NiCrO$_x$ | 25 |
| SnO₂ | 127 |
| N-doped Si₃N₄ | 237 |

The processes used in forming the coated article of Example 7 are set forth below. The sputtering gas flows (argon (Ar), oxygen (O), and nitrogen (N)) in the below table are in units of sccm (gas correction factor of about 1.39 may be applicable for argon gas flows herein), and include both tuning gas and gas introduced through the main. The line speed was about 5 m/min. The pressures are in units of mbar×10⁻³. The silicon (Si) targets, and thus the silicon nitride layers, were doped with aluminum (Al). The Zn targets in a similar manner were doped with about 2% Al. IBAD was used in forming each of the Ag IR reflecting layers, and also for the upper and lower silicon nitride layers.

| Sputtering Process Used in Example 7 | | | | | | | |
|---|---|---|---|---|---|---|---|
| Cathode | Target | Power(kW) | Ar | O | N | Volts | Pressure |
| IBAD | N-doped Si₃N₄ layer 3 formed using any of Examples 3-6 | | | | | | |
| C14 | Zn | 19.5 | 250 | 350 | 0 | 276 | 2.24 |
| C15 | Zn | 27.8 | 250 | 350 | 0 | 220 | 1.88 |
| C24 | Process of any of Examples 1-2 | | | | | | |
| C25 | NiCr | 16.5 | 350 | 0 | 0 | 510 | 2.33 |
| C28 | Sn | 27.3 | 250 | 454 | 350 | 258 | 2.30 |
| C29 | Sn | 27.3 | 250 | 504 | 350 | 246 | 1.97 |
| C39 | Sn | 30 | 250 | 548 | 350 | 257 | 2.29 |
| C40 | Sn | 28.5 | 250 | 458 | 350 | 245 | 2.20 |
| C41 | Sn | 30.8 | 250 | 518 | 350 | 267 | 2.45 |
| C43 | Si | 59.7 | 350 | 0 | 376 | 285 | 2.47 |
| C45 | Zn | 26.9 | 250 | 345 | 0 | 209 | 3.78 |
| C46 | Zn | 26.8 | 250 | 345 | 0 | 206 | 1.81 |
| C49 | Process of any of Examples 1-2 | | | | | | |
| C50 | NiCr | 16.6 | 250 | 75 | 0 | 575 | 1.81 |
| C54 | Sn | 47.3 | 250 | 673 | 350 | 314 | 1.92 |
| IBAD | N-doped Si₃N₄ layer 25 formed using any of Examples 3-6 | | | | | | |

It can be seen that in the aforesaid Example 7 both of silicon nitride layers 3 and 25 were ion beam treated in a manner so as to cause N-doping of N-doped Si₃N₄ to occur in each of the layers, and both of the IR reflecting layers were at least partially formed using IBAD.

After being sputter deposited onto the glass substrates, the hypothetical Example 7 coated article was heat treated in a manner sufficient for tempering and heat bending, and following this heat treatment had the following characteristics as measured in monolithic form.

| Characteristics of Example 7 (Monolithic; post - HT) | |
| --- | --- |
| Characteristic | Example 7 |
| Visible Trans. ($T_{vis}$ or TY)(Ill. C 2 deg.): | 80.0% |
| a* | −4.8 |
| b* | 10.7 |
| Glass Side Reflectance (RY)(Ill C, 2 deg.): | 8.3% |
| a* | −3.5 |
| b* | 7.8 |
| Film Side Reflective (FY)(Ill. C, 2 deg.): | 7.5% |
| a* | −5.8 |
| b* | 14.2 |
| $R_s$ (ohms/square) (pre-HT): | 2.74 |
| $R_s$ (ohms/square) (post-HT): | 2.07 |
| Haze: | 0.28 |

The coated article of Example 7 was then laminated to another corresponding heat treated and bent glass substrate to form a laminated vehicle windshield product. Following the lamination, the resulting coated article laminate (or windshield) had the following characteristics.

| Characteristics of Example 7 (Laminated; post - HT) | |
| --- | --- |
| Characteristic | Example 7 |
| Visible Trans. ($T_{vis}$ or TY)(Ill. D65 10°): | 77.8% |
| a* | −3.1 |
| b* | 3.5 |
| Glass Side Reflectance (RY)(Ill C, 2 deg.): | 9.0% |
| a* | 1.5 |
| b* | −9.1 |
| Film Side Reflective (FY)(Ill. C, 2 deg.): | 8.9% |
| a* | −1.1 |
| b* | −7.8 |
| $R_s$ (ohms/square): | see above |
| Haze: | 0.32 |

Figure 8:
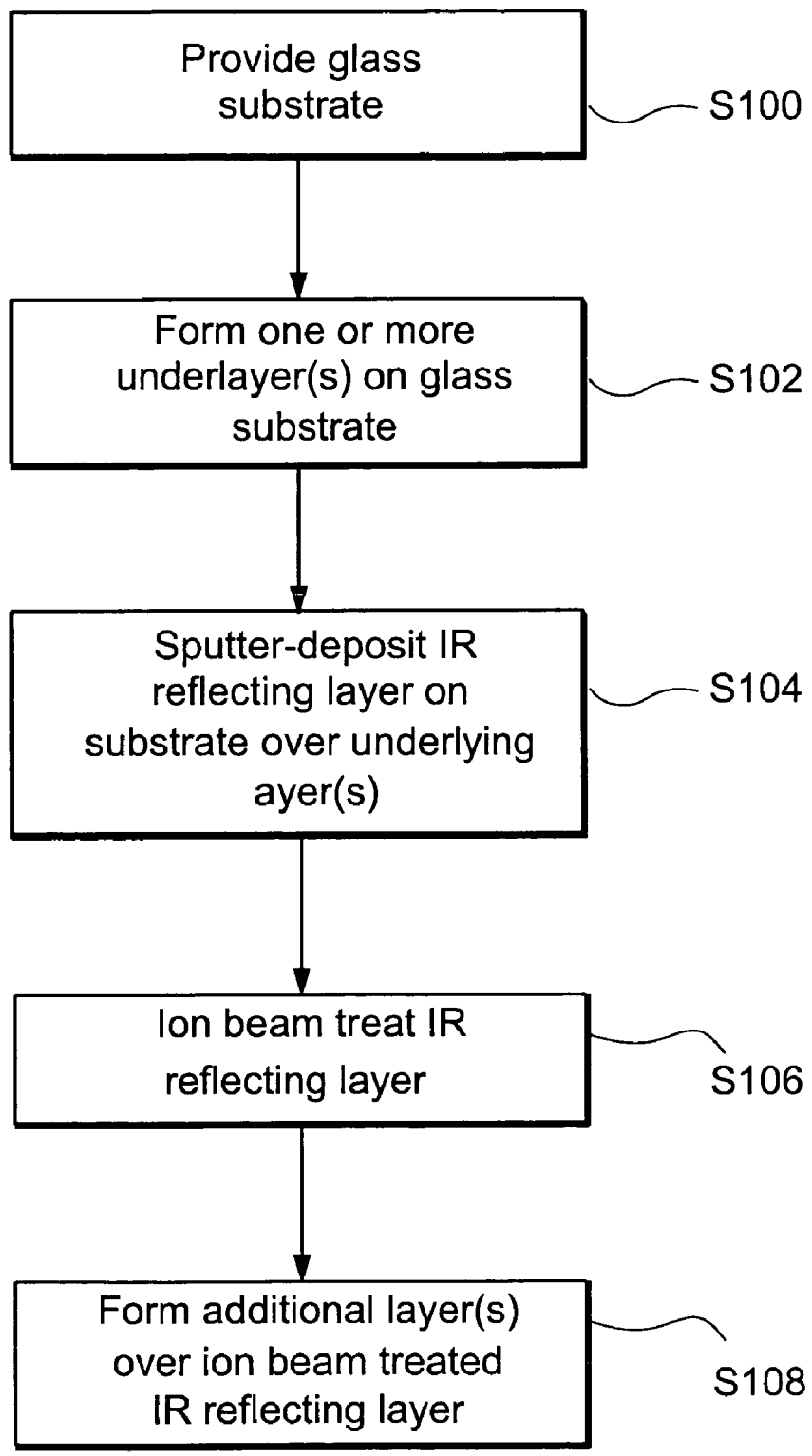
FIG. 8 is a flowchart illustrating certain steps carried out in accordance with another example embodiment of this invention.
Figure 9:
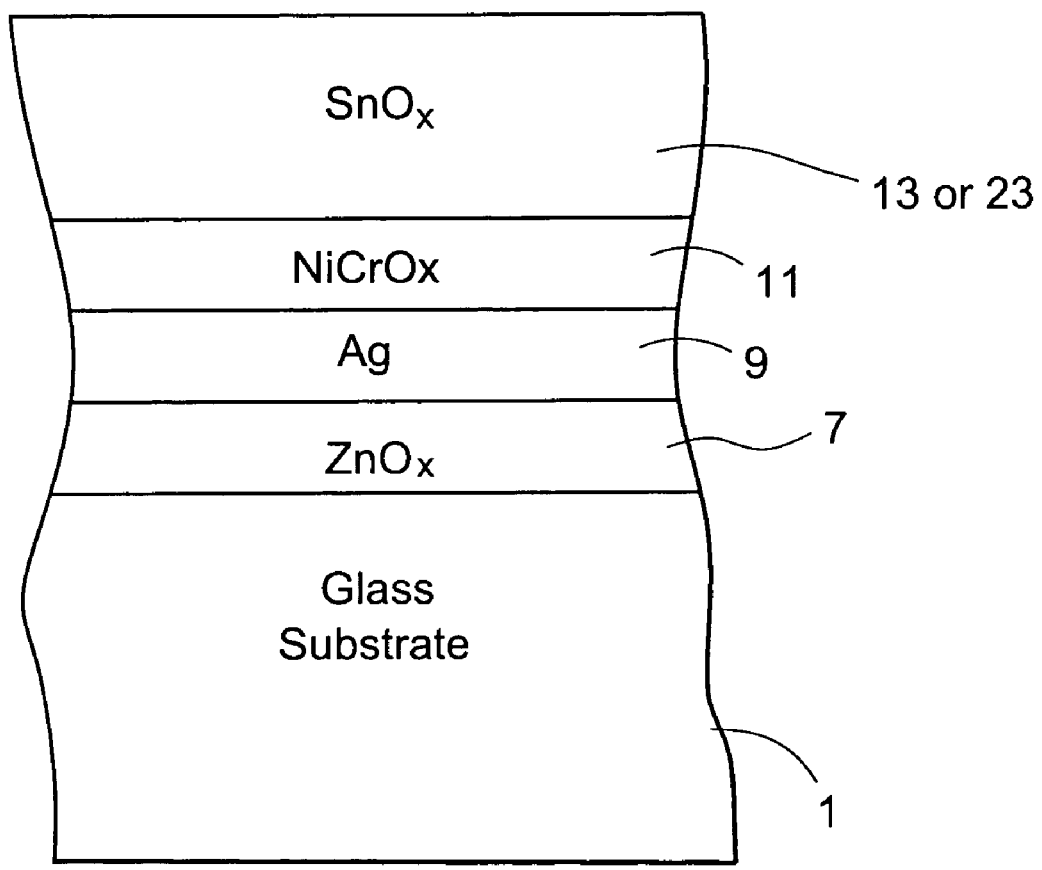
FIG. 9 is a cross sectional view of a coated article according to another example embodiment of this invention (which may be made according to the process of FIG. 8 for example).

FIGS. 8-9 illustrate another example embodiment of this invention. This embodiment is similar to those above, except that the ion beam treatment of the IR reflecting layer 9 is performed at least after the IR reflecting layer has been originally deposited by sputter-deposition or the like (this may be referred to as "peening" in certain instances). In this embodiment, details concerning various layers can be ascertained in view of the discussion above regarding the like numbered layers. The example layer stack shown in FIG. 9 is glass/zinc oxide/silver/nickel-chrome oxide/tin oxide.

Referring to FIGS. 8-9, an example process for making such a coated article will be described for purposes of example and without limitation. Glass substrate 1 is initially provided (S100). Then, at least one underlayer 7 (e.g., of or including zinc oxide or any other suitable material) is formed on the substrate either directly thereon or on the substrate over other layer(s) (S102). IR reflecting layer 9 (e.g., of or including Ag, Au or the like) is then sputter-deposited on the substrate 1 over the underlying layer(s) 7 (S104). Typically, in this embodiment, IBAD is not used during formation of layer 9, although in certain alternative instances it may be possible to do so.

After the IR reflecting layer 9 has been originally or initially formed via sputtering or the like, the IR reflecting layer 9 is then ion beam treated (S106). For example, see the ion beam source discussed above in connection with FIGS. 4-5. In certain example embodiments, the ion beam treatment of layer 9 may be performed using ions from an inert gas such as Ar and/or Kr. Moreover, in certain example instances, this treatment may be performed in a manner so as to cause the IR reflecting layer to realize compressive stress (as opposed to tensile resulting from mere sputtering). In other words, the ion beam treatment may cause the stress of the layer 9 to switch from tensile to compressive, or alternative to significantly reduce its tensile stress while remaining tensile in certain instances. Following the ion beam treatment (peening) of the IR reflecting layer 9 in S106, one or more additional layers 11, 13 and/or 23 may then be formed on the substrate 1 over the ion beam treated IR reflecting layer (S108).

Still referring to the FIG. 8-9 embodiment, the ion beam treatment may in certain embodiments result in an IR reflecting layer 9 that is graded with respect to argon and/or krypton content. In particular, an upper portion of the IR reflecting layer 9 includes a higher Ar and/or Kr concentration than does a lower portion of the IR reflecting layer. This is because Ar and/or Kr ions from an ion beam do not impinge upon the layer during formation thereof until after the layer has been originally or initially formed by sputter-deposition. Accordingly, the upper portion of the resulting IR reflecting layer 9 includes a higher Ar and/or Kr content than does the lower portion of the layer. This grading would be for content of another element (e.g., Xe) if the other element(s) was used instead of or in place of Ar and/or Kr in the ion beam in alternative embodiments of this invention. In certain example embodiments, an upper portion of the IR reflecting layer 9 has an Ar and/or Kr (or other inert element) concentration at least 10% higher than that of another portion (e.g., a lower portion) of the IR reflecting layer located therebelow, more preferably at least 20% higher, and most preferably at least 30% higher. The example "lower portion" is merely some arbitrarily selected portion of the layer at least partially below the center point and/or below the upper portion of the layer, where the "upper portion" of the layer is some arbitrarily selected portion of the layer at least partially above the center of the layer. In certain example instances, the upper portion may be the upper 20 Å of the IR reflecting layer, and the lower portion may be the lower 60 Å (or 20 Å) of the layer. The lower portion of the layer may even have an Ar and/or Kr content of 0 in certain instances.

Example ion beam treatment techniques for the FIG. 8-9 embodiment are discussed above with respect to other embodiments of this invention.

Additional Examples

Both Example 8 (Ex. 8) and Comparative Example 8 (Comp. Ex. 8) had the following layer stack, using 4.0 mm clear glass, where the layers are listed from the glass substrate moving outwardly:

| Ex. 8 & Comp. Ex. 8 Layers | Thickness (angstroms) |
| --- | --- |
| zinc-aluminum oxide | 122 |
| silver | 120 |
| nickel-chrome oxide | 2-25 |
| tin oxide | 124 |

The difference between Example 8 and Comparative Example 8 was that ion beam treatment (peening type) was used on the silver in Example 8 but not in Comparative Example 8. All layers were originally deposited by sputtering. While no ion beam treatment was performed for Comparative Example 8, the ion beam treatment in Example 8 of the silver layer (after it was sputter-deposited) used the following parameters: 300 ml Kr gas flow in ion beam source; 0.3 A current in ion source (99 W power). Thus, the ion beam for Example 8 consisted of or consisted essentially of Kr ions. The results comparing Example 8 and Comparative Example 8 are set forth below.

|  | Ex. 8 | Comparative Ex. 8 |
|---|---|---|
| Sheet Resistance ($R_s$, ohms/square): | 3.5 | 3.7 |
| Ion beam treat Ag?: | yes | no |
| Emittance (normal): | 3.51% | 4.07% |
| Stress Type: | compressive | tensile |

It can be seen from the above that the use of the ion beam treatment of the silver (see Example 8) improved (i.e., lowered) sheet resistance and emittance of the IR reflecting layer 9, and switched the stress of the layer to compressive which may be advantageous for durability purposes.

Both Example 9 (Ex. 9) and Comparative Example 9 (Comp. Ex. 9) had the following layer stack, using 4.0 mm clear glass, where the layers are listed from the glass substrate moving outwardly:

Example 9 silicon nitride
zinc-aluminum oxide
silver
nickel-chrome oxide
silicon nitride
tin oxide The difference between Example 9 and Comparative Example 9 was that ion beam treatment (peening type) was used on the silver in Example 9 but not in Comparative Example 9. All layers were originally deposited by sputtering. While no ion beam treatment was performed for Comparative Example 9, the ion beam treatment in Example 9 of the silver layer (after it was sputter-deposited) used the following parameters: 300 ml Kr gas flow in ion beam source; 0.4 A current in ion source. Thus, the ion beam for Example 9 consisted of or consisted essentially of Kr ions. The results comparing Example 9 and Comparative Example 9 are set forth below.

|  | Ex. 9 | Comparative Ex. 9 |
|---|---|---|
| Sheet Resistance ($R_s$, ohms/square): | 3.9 | 3.9 |
| Ion beam treat Ag?: | yes | no |
| Emittance (normal): | 4.18% | 4.30% |
| Stress Type: | compressive | tensile |

It can be seen from the above that the use of the ion beam treatment of the silver (see Example 9) improved (i.e., lowered) emittance of the IR reflecting layer 9, and switched the stress of the layer to compressive which may be advantageous for durability purposes.

While the aforesaid Examples ion beam treat layers comprising silicon nitride and/or silver, this invention is not so limited. Other layers may be ion beam treated in a similar manner.

Figure 10:
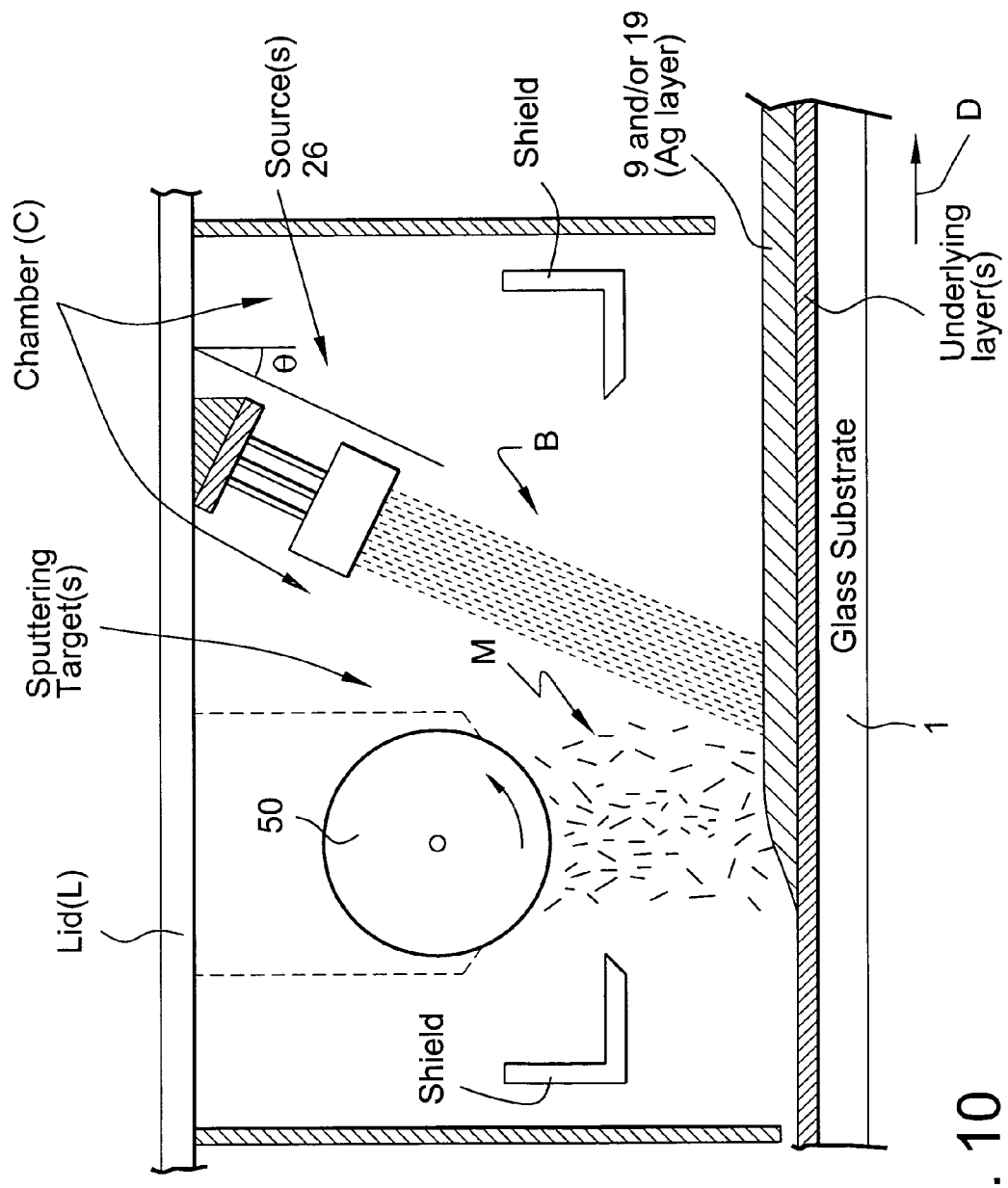
FIG. 10 is a schematic diagram illustrating both a sputtering target(s) and an ion source(s) provided in the same deposition chamber, and supported by the same lid (this may be used with any of the other embodiments discussed and/or illustrated herein).

FIG. 10 illustrates an example embodiment of this invention where a sputtering target(s) 50 and an ion source(s) 26 are located in the same deposition chamber C so that they are at approximately the same pressure (e.g., at a pressure less than atmospheric pressure). Thus, for example, the pressure in the chamber C where both the target 50 and ion source 26 are located would be a first pressure, and the pressure in an adjacent different chamber where other target(s) is/are located would be a second pressure likely different than the first pressure. As an example, the adjacent different chamber may house target(s) for forming a contact layer (7, 11, 17, or 21) adjacent the ion beam treated layer. For example, see the example pressures discussed above. Moreover, the gas (which includes only a single gas or a mixture of different gases) present in the chamber C where both the target 50 and ion source 26 are located would be a first gas, whereas the gas in an adjacent different chamber where other target(s) is/are located would be a second gas likely different than the first gas. For example, a first gas comprising Ar and/or Kr may be present in chamber C where the IR reflecting layer is formed, whereas a different second gas including oxygen (and possibly Ar or the like) may be present in an adjacent chamber where a contact layer (7, 11, 17, or 21) is formed.

The different deposition chambers are typically separated by one or more walls and/or partitions, and possibly by vacuum gaps to prevent or reduce gas cross talk between chambers. Thus, in certain example embodiments, there is provided an apparatus for forming a coated article, the apparatus comprising a plurality of deposition chambers, including at least first, second and third chambers; a first sputtering target(s) (e.g., of Zn, ZnAl, or any other suitable material) located in the first chamber for forming layer 7 for example; a second sputtering target(s) 50 (e.g., of Ag) and an ion source 26 each located in the second chamber for forming layer 9, wherein the second chamber may be at a different pressure and/or use a different gas atmosphere than the first chamber; and a third sputtering target (e.g., of Ni, Cr, NiCr, or any other suitable material) located in the third chamber for forming layer 11 for example (different materials may of course be used in other alternative embodiments).

In certain example embodiments, a lid L of a deposition chamber supports both a sputtering target(s) (e.g., rotatable CMAG target, or planar target) 50 and at least one ion source 26. This permits sputtering and ion beam treatment to take place in the same deposition chamber C at approximately the same pressure and/or gas atmosphere. Space can also be saved in this respect, since a separate chamber is not needed for the ion source. A shield(s) may be provided in order to cause material from the sputtering target(s) 50 and/or ion source(s) 26 to be directed toward certain portions of the substrates which may be moving in direction D. It is noted that the structure shown in FIG. 10 may be located either above or below the moving substrate 1 in different example embodiments of this invention (e.g., in certain embodiments, both the target 50 and ion source 26 may be located above the substrate, whereas in other example embodiments both the target 50 and ion source 26 may be located below the substrate 1.

The use of both a sputtering target(s) 50 and an ion source(s) 26 in the same chamber C can be used in forming any suitable layer (e.g., Ag inclusive layer, or any other suitable type of layer) of various types of coatings on substrates. For purposes of example, and without limitation, such a structure with both an ion source(s) 26 and a sputtering target(s) 50 supported by the same lid L of a deposition chamber C, and/or both located in the same chamber C at approximately the same pressure, can be used in any of the example embodiments discussed herein. For example, such a structure can be used in embodiments for peening an IR reflecting layer (discussed above), in IBAD embodiments where the IR reflecting layer is formed using IBAD (discussed above), and/or in embodiments involving a seed layer which is thereafter subjected to ion beam treatment (discussed above) discussed herein.

Still referring to FIG. 10, it can be seen that the ion beam B from the source 26 is directed toward the substrate 1. In certain example embodiments, the angular orientation of the ion source 26 may be adjusted so that the source may be oriented at different angles θ. In particular, the ion source 26 may be adjusted so that the center of the ion beam B from the source is directed toward the substrate 1 at any angle θ relative to the vertical of from about 0 to 50 degrees, more preferably from about 0 to 30 degrees, and most preferably from about 0 to 20 degrees. In certain example embodiments of this invention, the ion source is mounted in the chamber so that an ion beam B from the ion source 26 forms an angle θ relative to the vertical of from about 5 to 30 degrees, more preferably from about 5 to 20 degrees, and most preferably from about 5 to 15 degrees.

Thus, for example, the same ion source may be used for both peening and IBAD embodiments, with a simple change in angle θ being performed to change from an IBAD embodiment to a peening embodiment. For purposes of example, a small angle θ (e.g., from about 0-5 degrees or the like) may be used in peening embodiments where the IR reflecting layer is ion beam treated after it has been sputter deposited. In certain example peening embodiments, the area of ion beam B impact on the layer (e.g., 9 and/or 19) does not simultaneously overlap, or does not substantially simultaneously overlap, the area where material M from the target impacts the substrate. However, in certain IBAD embodiments, the area of ion beam B impact on the layer (e.g., 9 and/or 19) does simultaneously overlap the area where material M from the target 50 impacts the layer. Thus, a larger angle θ (e.g., from about 5-50 degrees or the like, depending on the position of the substrate and the sputtering target 50) may be used in IBAD embodiments for forming layer 9 and/or 19. The more overlap, at a given point in time, between (a) the area of ion beam B impact on the layer (e.g., 9 and/or 19), and (b) the area where material M from the target 50 impacts the layer, the higher the energy involved in the layer formation process. Higher energy tends to densify, for example, the IR reflecting layer thereby improving crystallinity and/or mobility properties thereof thereby resulting in improved thermal/electrical properties.

The gas used by the ion source 26 may be Ar, Kr, $O_2$, mixtures thereof, or any other. Moreover, the gas used by the ion source 26 may be introduced into the ion source via gas inlet(s) at a rear of the source, and/or from the front of the source from the atmosphere of the deposition chamber C. In the latter case, the same gas and/or gas ratio is used by both the target sputtering system adjacent the target(s) 50 and the ion source(s) 26, which improves efficiency of the system.

In certain other embodiments of this invention, any of the aforesaid embodiments may be applied to other coatings. For example and without limitation, any of the aforesaid embodiments may also be applied to coated articles and thus solar control coatings of one of more of U.S. Pat. Nos. 2003/0150711, 2003/0194570, 6,723,211, 6,576,349, 5,514,476, 5,425,861, all of which are hereby incorporated herein by reference.

While many of the above-listed embodiments are used in the context of coated articles with solar control coatings, this invention is not so limited. For example, ion beam treating of layers as discussed herein may also be used in the context of other types of product and coatings relating thereto.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a coated article, the method comprising:
   providing a glass substrate;
   forming at least one dielectric layer on the substrate;
   providing at least one ion source and at least one sputtering target in a first deposition chamber;
   forming an infrared (IR) reflecting layer on the substrate over at least the first dielectric layer, where said forming of the IR reflecting layer comprises depositing a layer comprising silver by way of sputtering without using an ion beam, and thereafter ion beam treating said layer comprising silver with an ion beam comprising argon and/or krypton; and
   forming at least one additional dielectric layer on the substrate over at least the IR reflecting layer.

2. The method of claim 1, wherein the sputtering target and the ion source in the first chamber are both located in an atmosphere of the first chamber which is at a first pressure, wherein the first pressure is a pressure less than atmospheric.

3. The method of claim 2, further comprising forming the dielectric layer located between the substrate and the IR reflecting layer using at least a sputtering target located in a second deposition chamber different than the first chamber, and wherein the first pressure in the first chamber can be different than a second pressure in the second chamber.

4. The method of claim 1, wherein a common lid of at least the first chamber supports both the ion source and the sputtering target that are located in the first chamber.

5. The method of claim 1, wherein the IR reflecting layer consists essentially of silver.

6. The method of claim 1, wherein the sputtering target and the ion source in the first chamber are both located in an atmosphere of the first chamber which is at a first pressure, wherein the first pressure is a pressure less than atmospheric pressure, and wherein the method further comprises forming a contact layer over and contacting the IR reflecting layer using at least a sputtering target located in a second deposition chamber different than the first chamber, and wherein the first pressure in the first chamber can be different than a second pressure in the second chamber.

7. The method of claim 6, wherein the contact layer comprises an oxide of Ni and/or Cr.

8. The method of claim 1, wherein said at least one dielectric layer comprises zinc oxide.

9. The method of claim 1, wherein said additional dielectric layer comprises tin oxide and/or silicon nitride.

10. The method of claim 1, wherein the ion beam consists essentially of ions from an inert gas used in the ion sources.

11. The method of claim 1, wherein the ion beam is substantially free of oxygen ions.

12. The method of claim 1, wherein the ion beam is utilized in a manner so as to cause the IR reflecting layer to have compressive stress.

13. The method of claim 1, further comprising forming at least a layer comprising Ni and/or Cr on the substrate over at least the IR reflecting layer.

14. The method of claim 1, wherein the ion beam is utilized in a manner sufficient to cause a sheet resistance ($R_s$) and/or emissivity of the IR reflecting layer to be less than if the ion beam had not been used.

15. The method of claim 1, wherein the ion beam is utilized in a manner sufficient to cause a sheet resistance ($R_s$) and/or emissivity of the IR reflecting layer to be at least 5% less than if the ion beam had not been used.

16. The method of claim 1, further comprising heat treating the coated article in a manner sufficient for at least one of tempering and heat bending, so that following said heat treating the coated article has a visible transmission of at least 70% and a sheet resistance ($R_s$) of no greater than 5.0 ohms/square.

17. The method of claim 1, further comprising heat treating the coated article in a manner sufficient for at least one of tempering and heat bending, so that following said heat treating the coated article has a visible transmission of at least 75% and a sheet resistance ($R_s$) of no greater than 3.0 ohms/square.

18. The method of claim 1, wherein prior to any optional heat treating, the coated article in monolithic form has a visible transmission of at least 70% and a sheet resistance ($R_s$) of no greater than 5.0 ohms/square.

19. The method of claim 1, further comprising forming a layer comprising zinc oxide on the glass substrate in a position so that the IR reflecting layer is formed directly on and contacting the layer comprising zinc oxide, and wherein the IR reflecting layer comprises silver.

20. The method of claim 1, further comprising forming another IR reflecting layer, said another IR reflecting layer comprising silver.

21. The method of claim 1, wherein the ion source is mounted so as to be adjustable, so that a direction of the ion beam is adjustable across a range of angles θ by adjusting a mounting position of the ion source.

22. A method of making a coated article, the method comprising:

providing at least one ion source and at least one sputtering target in a first deposition chamber;

forming an IR reflecting layer, where said forming of the IR reflecting layer comprises depositing a layer comprising silver by way of sputtering without using an ion beam, and thereafter ion beam treating said layer comprising silver with an ion beam using at least one inert gas and/or inert gas ion; and forming at least one additional layer over at least the IR reflecting layer.

23. The method of claim 22, wherein the sputtering target and the ion source in the first chamber are both located in an atmosphere of the first chamber which is at a first pressure, wherein the first pressure is a pressure less than atmospheric pressure.

24. The method of claim 23, wherein the method further comprises forming a dielectric layer located between a substrate and the IR reflecting layer using at least a sputtering target located in a second deposition chamber different than the first chamber, and wherein the first pressure in the first chamber is different than a second pressure in the second chamber.

25. The method of claim 22, wherein a common lid of at least the first chamber supports both the ion source and the sputtering target that are located in the first chamber.

26. The method of claim 1, wherein the ion source is mounted in the chamber so that an ion beam from the ion source forms an angle θ relative to the vertical of from about 5 to 30 degrees.

27. The method of claim 22, wherein the ion source is mounted in the chamber so that an ion beam from the ion source forms an angle θ relative to the vertical of from about 5 to 30 degrees.

\* \* \* \* \*